(12) United States Patent
Rathee et al.

(10) Patent No.: US 11,909,407 B2
(45) Date of Patent: Feb. 20, 2024

(54) METHOD AND SYSTEM OF DYNAMICALLY CONTROLLING RESET SIGNAL OF IQ DIVIDER

(71) Applicant: SAMSUNG ELECTRONICS CO., LTD., Suwon-si (KR)

(72) Inventors: Praveen Rathee, Bengaluru (IN); Vishnu Kalyanamahadevi Gopalan Jawarlal, Bengaluru (IN); Sanjeeb Kumar Ghosh, Bengaluru (IN); Avneesh Singh Verma, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/947,845

(22) Filed: Sep. 19, 2022

(65) Prior Publication Data
US 2023/0412176 A1    Dec. 21, 2023

(30) Foreign Application Priority Data

Jun. 17, 2022 (IN) ............................. 202241034814

(51) Int. Cl.
| H03L 7/193 | (2006.01) |
| H03L 7/14 | (2006.01) |
| H03K 5/135 | (2006.01) |
| H03K 21/08 | (2006.01) |

(52) U.S. Cl.
CPC ............. *H03L 7/193* (2013.01); *H03K 5/135* (2013.01); *H03K 21/08* (2013.01); *H03L 7/148* (2013.01)

(58) Field of Classification Search
None
See application file for complete search history.

(56) References Cited

U.S. PATENT DOCUMENTS

| 10,386,885 B2* | 8/2019 | Kaneko ..................... G06F 1/04 |
| 11,108,400 B1* | 8/2021 | Armstrong ............ H03L 7/1976 |
| 2010/0054390 A1 | 3/2010 | Kim et al. |
| 2023/0138296 A1* | 5/2023 | Lee .......................... H03L 7/16 375/362 |

FOREIGN PATENT DOCUMENTS

CN        104993826 A     10/2015

OTHER PUBLICATIONS

Singh et al., "Dynamics of high-frequency CMOS dividers", 2002 IEEE International Symposium on Circuits and Systems, May 26-29, 2002, (5 pages total).

(Continued)

*Primary Examiner* — Cassandra F Cox
(74) *Attorney, Agent, or Firm* — Sughrue Mion, PLLC

(57) ABSTRACT

A system and method to dynamically control a reset signal for an IQ divider are provided. The system includes an IQ divider configured to output a IQ divider output clock; an input configured to receive a reference clock; a failure sensing circuit configured to sense a failure in the IQ divider output clock, the failure sensing circuit including an automatic frequency calibration (AFC) logic; and a control circuit configured to control a reset signal provided to the IQ divider, based on an output of the failure sensing circuit corresponding the failure sensed by the failure sensing circuit.

20 Claims, 28 Drawing Sheets

(56) References Cited

OTHER PUBLICATIONS

Zhang et al., "Start-up analysis for differential ring oscillator with even number of stages", 2010 IEEE Asia Pacific Conference on Circuits and Systems, Dec. 6-9, 2011, (5 pages total).

Yan et al., "Verifying Global Start-Up for a Mobius Ring-Oscillator", Jun. 13, 2013, (28 pages total).

Huang et al., "A power-efficient 14.8-GHz CMOS programmable frequency divider with quadrature outputs in 40-nm CMOS process", Analog Integr Circ Sig Process, DOI 10.1007/s10470-017-1037-9, Springer Science+Business Media, LLC Sep. 11, 2017, (8 pages total).

Khaled M. Sharaf, "A 5mW 19-43 GHz Broadband CMOS I/Q Frequency Divider", 25th National Radio Science Conference (NRSC 2008), Mar. 18-20, 2008, (8 pages total).

\* cited by examiner

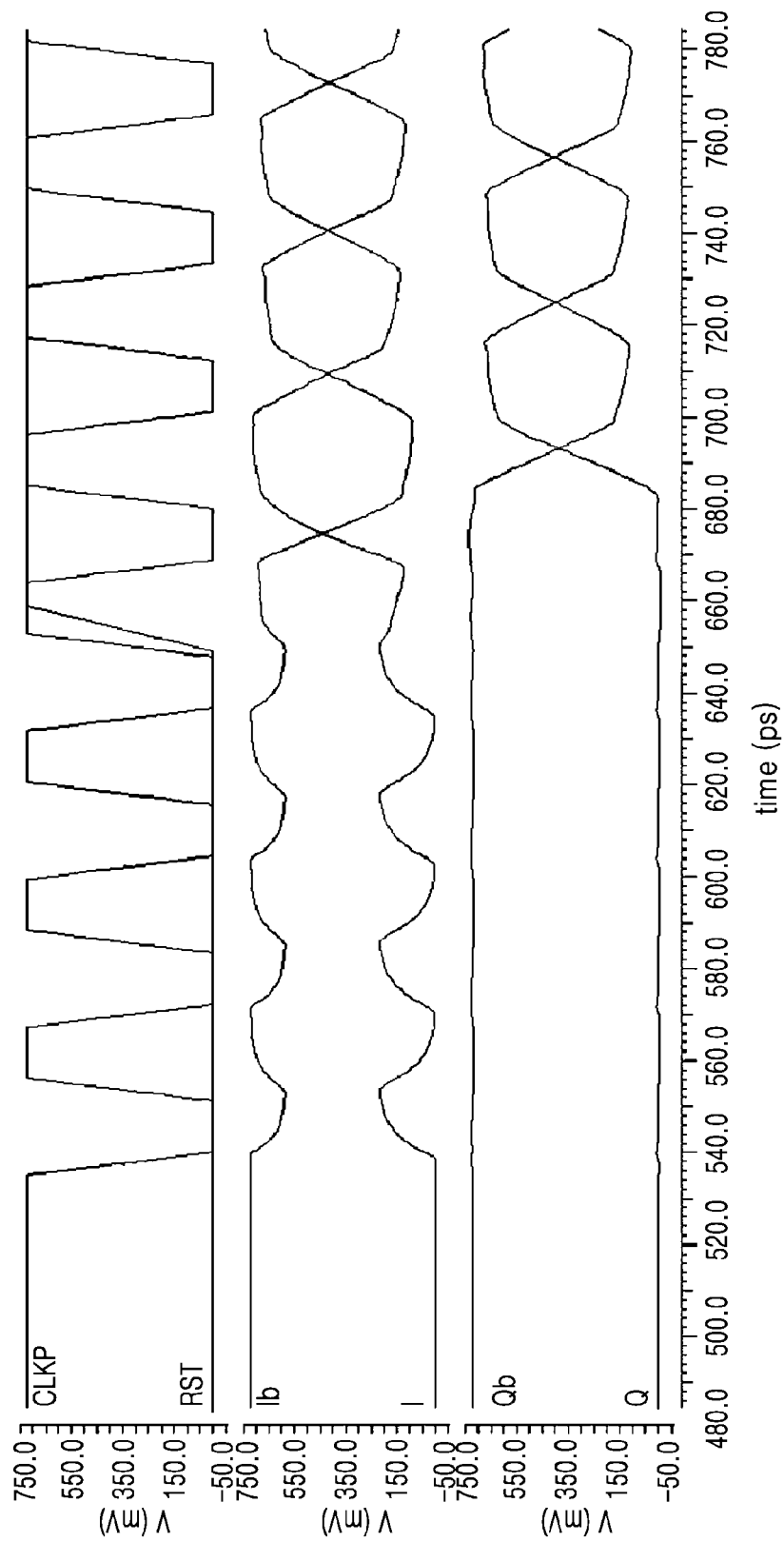

| Block | Power Split(%) |
|---|---|
| Reset Synchronizer | 25.8 |
| Clock Gating | 46.7 |
| IQ DIV Core | 7.23 |
| Output Buffers | 20.27 |

METHOD AND SYSTEM OF DYNAMICALLY CONTROLLING RESET SIGNAL OF IQ DIVIDER

CROSS-REFERENCE TO RELATED APPLICATION(S)

This application is based on and claims priority to Indian Patent Application No. 202241034814, filed on Jun. 17, 2022, in the Indian Patent Office, the disclosure of which is incorporated by reference herein in its entirety.

BACKGROUND

The present disclosure relates to IQ dividers, and more specifically is related to an ultra-low power, ultra high speed IQ divider and a method to dynamically control a reset signal thereof.

A frequency IQ divider may suffer from latchup which depends on an initial state of nodes in an IQ divider and deassertion of a reset signal. The IQ divider is a critical block and latchup can be a cause of functional failure. Latchup due to asynchronous reset deassertion can be addressed using a reset synchronizer with an input clock (>20 GHz) input. However, a reset synchronizer increases load on a high speed clock path resulting in a substantial power increase.

Initialization of nodes in an IQ divider to solve the latchup issue results in a contention issue which is solved either by clock gating or by embedding reset switches in a data path. Embedding reset switches in a data path results in a three stack structure (versus two-stack) and causes a speed degradation (about 33% for fixed power). If implemented along with a reset synchronizer, clock gating results in a power consumption increase of about 45%. Thus, there is a need to provide reset control logic working on a low speed reference clock thus saving both area (about 55%) and power (about 70% of the IQ divider and about 10% of PLL power).

SUMMARY

One or more example embodiments provide an ultra-low power, ultra high speed IQ Divider with dynamic reset control.

Further, one or more example embodiments provide an ultra high speed (e.g., 20 GHz-32 GHz) 2-stack CMOS IQ divider without clock gating and reset synchronizer.

Further still, one or more example embodiments provide a method of dynamically controlling the reset operation in the IQ divider According to an aspect of an example embodiment, there is provided a system including: an IQ divider configured to output a IQ divider output clock; an input configured to receive a reference clock; a failure sensing circuit configured to sense a failure in the IQ divider output clock, the failure sensing circuit including an automatic frequency calibration (AFC) logic; and a control circuit configured to control a reset signal provided to the IQ divider, based on an output of the failure sensing circuit corresponding the failure sensed by the failure sensing circuit.

According to an aspect of an example embodiment, there is provided a method of dynamically controlling a reset signal for an IQ divider by a system, the method including: monitoring an output frequency of the IQ divider with respect to an input reference clock frequency of a reference clock; detecting a failure in the IQ divider based on the monitored output frequency of the IQ divider; and dynamically controlling, the reset signal based on the detected failure.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 5, 6A, 6B, and 7 are waveform diagrams and diagrams showing impact of reset switch sizing, and illustrating solutions for initializing reset state, according to example embodiments;

DETAILED DESCRIPTION

Figure 1:
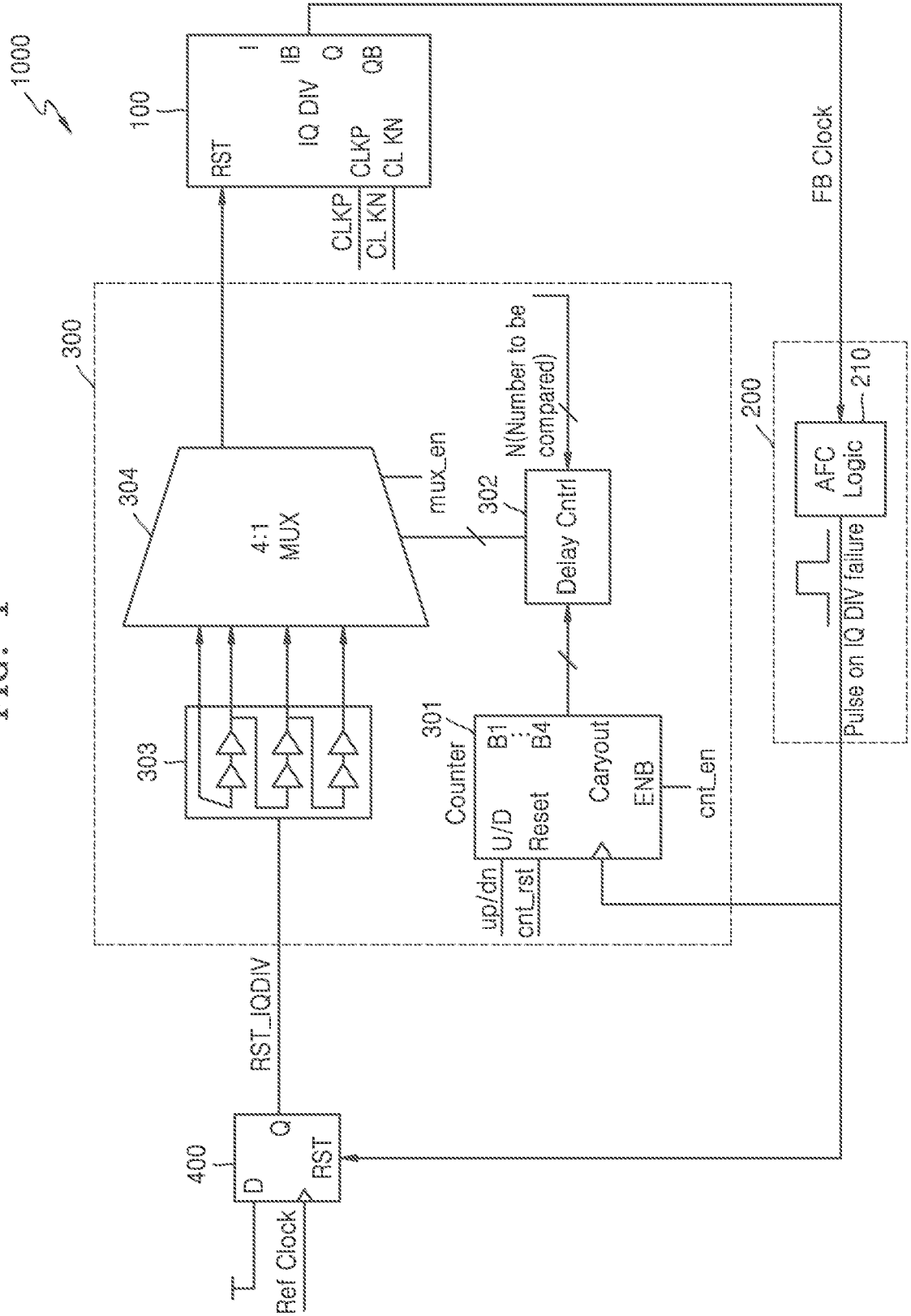
FIG. 1 is a block diagram of a system for controlling a reset signal for an IQ divider, according to an example embodiment.

The example embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

As is traditional in the field, embodiments may be described and illustrated in terms of blocks which carry out a described function or functions. These blocks, which may be referred to herein as managers, units, modules, hardware components or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and software. The circuits may, for example, be embodied in one or more semiconductor chips, or on substrate supports such as printed circuit boards. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

Accordingly, example embodiments herein provide a method to dynamically control a reset operation/signal in an IQ divider to solve latch up issue without using a clock gating technique and a reset synchronizer. The method discloses a counter based sense mechanism to determine if the IQ divider is functional (i.e. doesn't have a latch up issue) or non-functional (i.e. has latch up issue). In an embodiment, the IQ divider experiences failure in different scenarios. Further, the method discloses using an outcome of the sense mechanism to control the reset operation/signal with respect to a high speed input clock.

The example embodiments herein also provide a method to classify the failing scenario of the IQ divider and resolve it to support fast a wake-up operation of the IQ divider.

The embodiments herein further provide the IQ divider comprising a failure sensing circuitry for detecting a failure in the IQ divider and a controlling circuitry for controlling the reset signal based on an output of the failure sensing circuitry.

The example embodiments herein also provide a reset switch to avoid contention in the reset state of the IQ divider that arises due to removal of clock gating and reset synchronizer from the IQ divider.

Unlike a related art method, the method of controlling the reset signal according one or more embodiments of the present disclosure, eliminates the IQ Divider failure due to improper reset deassertion while saving about 66% power with respect to the reset synchronizer based solution. Further, there is an area saving of about 60%. Also there is a reduction in power supply noise induced jitter of about 50% with respect to reset synchronizer based solutions.

Referring now to the drawings, where similar reference characters denote corresponding features consistently throughout the figures, there are shown example embodiments.

FIG. 1 is a block diagram of an system 1000 for controlling a reset signal (RST) 101 for an IQ divider (IQ DIV)100, according to an example embodiment.

In an embodiment, the system 1000 comprises the IQ divider 100, a failure sensing circuitry 200, a control circuitry 300, and a reference clock 400.

In an embodiment, the IQ divider 100 is a static frequency divider and is configured to obtain an output frequency as a fraction of the input frequency. The reset signal (RST) 101 is an input to the IQ divider 100. The inputs to a D flip-flop in FIG. 1 are logic high/supply (D), clock (Ref CLOCK) and reset (RST). In another embodiment, an input to the IQ divider 100 is a differential Voltage Controlled Oscillator (VCO) clock (<20 GHz) while an output of the IQ divider 100 is a 4-quadrature phase divider by 2 clocks (I, Q, QB, and IB)

The failure sensing circuitry 200 receives an output of the IQ divider 100 and determines a failure in the output. The input to the IQ divider 100 is differential VCO clocks (CLKP and CLKN) (>20 GHz) while the output (FB Clock) of the IQ divider 100 is 4-quadrature phase divided by 2 clocks (I, Q, IB, QB). In case of failure there is no clock at the output of IQ divider 100. The failure sensing circuitry 200 is an automatic frequency control (AFC) logic 210 comprising a counter in the present embodiment. The AFC logic 210 detects the clock (FB Clock) at the output of the IQ divider 100 and triggers the counter for a predetermined time (in terms of reference clock cycles). In case of failure, the clock is not present at the output of the IQ divider 100 and hence the counter of the AFC logic 210 is not triggered indicating the failure.

Once the failure sensing circuitry 200 detects the failure, the control circuitry 300 controls the reset signal 101 based on the detected failure. The control circuitry 300 comprises a counter 301, a delay control element 302, a variable delay element 303 and a multiplexer (MUX) 304. In an embodiment, the variable delay element 303 provides different values of delays as an input to the multiplexer 304. The delay control element 302 is a control input to the multiplexer 304 for selecting an output of the multiplexer 304.

In an embodiment, the failure sensing circuitry 200 informs the control circuitry 300 about the failure. Then, the delay control element 302 and the counter 301 determine a failure scenario/type of failure and accordingly controls the reset signal 101.

In an embodiment, the reset signal 101 is reasserted asynchronously in the IQ divider 100 to restore an initial condition and deasserted on a next positive edge of reference clock 400 by the control circuitry 200 upon failure detection of the IQ divider 100. Further, based on a frequency relation between the reference clock 400 and an IQ divider input clock, there is a movement of the reset signal 101 with respect to the IQ divider input clock. This will, eventually, in N reference clock cycles take reset signal to the correct position with respect to the input clock state avoiding a latchup failure. The incorrect window to deassert reset signal is present only in one of the logic states of the input clock. This incorrect window amounts to less than 50% of the input clock period.

In an embodiment, if the reference clock 400 and the IQ divider 100 input clock have non-integer frequency relation, then there is a change in a relative position of reset deassertion (triggering reset deassertion) with respect to the positive edge of the IQ divider input clock which can take reset removal point out of latchup window in certain number of reference cycles.

In another embodiment, when the reference clock and the IQ divider 100 input clock have either integer relation or non-integer frequency relation but the fractional part of the input frequency divided by reference frequency is very small, then there is either no or very small movement of positive edge of reference clock with respect to the positive edge of the IQ divider input clock. In such scenario, a programmable delay is introduced in the present solution.

In another embodiment, where the frequency of the input clock to the IQ divider divided by the reference clock 400 is integer or non-integer but with a very small fractional part, the reset control circuitry 300 ensures a solution within fixed number of reference cycles of the reference clock 400.

Figure 2:
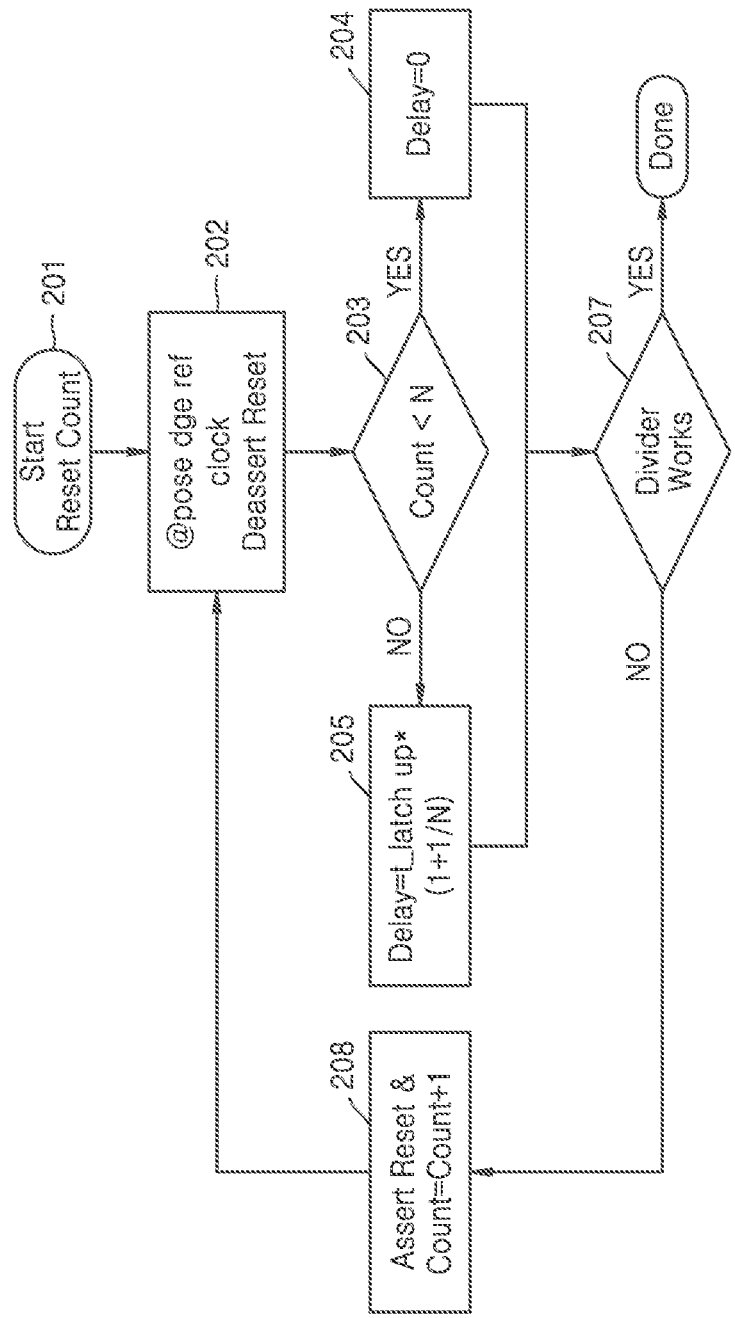
FIG. 2 is a flow diagram illustrating a flow controlling the reset signal by the control circuitry, according to an example embodiment.

The method of controlling the reset signal 101 using the control circuitry is explained in detail in FIG. 2.

The reference clock 400 provides an input to the failure sensing circuitry 200 and the control circuitry 300. The failure sensing circuitry 200 may comprise the AFC logic 210.

In an embodiment, in the failure sensing circuitry 200, the reference clock 400 is used to control an enable signal of the internal counter of the AFC logic 210 such that the enable signal of the internal counter is high for fixed number of reference clock cycles 400 and a clock driving the internal counter is the IQ divider 100 output clock.

In another embodiment, in the control circuitry 300, a reset deassertion flip-flop is driven by the reference clock 400.

FIG. 2 is a flow diagram, illustrating a flow diagram of controlling the reset signal 101 by the control circuitry 300, according to an example embodiment.

As shown in FIG. 2, the method includes starting the counter 301 at operation 201. Further, the reset signal 101 is deasserted at a positive edge of the reference clock 400 at operation 202. At operation 203, it is determined whether a value of the counter 301 is less than a pre-defined value N.

In an embodiment, in a failing case due to latchup there is static output on the IQ divider 100 output clock which will result in the count value being below certain threshold, signaling failure. When failure is detected, a pulse signal is generated which reasserts the reset signal 101 asynchronously and also triggers failure counter.

In response to determining that the value of the counter 301 is less than the pre-defined value N in operation 203, it is determined that the delay introduced is zero at operation 204. In response to determining that the value of the counter 301 is not less than the pre-defined value N in operation 203, it determined that the delay is present in operation 205. In an embodiment, initially till the count value is <N the zero delay path is selected in variable delay element and after the count value >N extra delay is inserted in variable delay element.

At operation 207, the failure sensing circuitry 200 determines whether there is a failure at the IQ divider 100. In response to determining that the failure is detected, the reset signal 101 is reasserted and the counter 301 is increased at operation 208.

Thus as seen above, first the reset signal 101 is deasserted on the positive edge of the reference clock 400 and the IQ divider output is analyzed for certain number of reference cycles to check whether the IQ divider 100 has failed. If the failure is detected then the reset signal 101 is reasserted asynchronously and then again deasserted on the next positive edge of the reference clock 400. The loop continues until either the IQ divider 100 starts working or the counter 301 value becomes more than the pre-defined value.

In another embodiment, if the IQ divider 100 does not work within N reference cycles, the delay control adds delay in a reset path of the reset signal 101.

The various actions, acts, blocks, steps, or the like in the flow diagram of FIG. 2 may be performed in the order presented, in a different order or simultaneously. Further, in some embodiments, some of the actions, acts, blocks, steps, or the like may be omitted, added, modified, skipped, or the like without departing from the scope of the invention.

Figure 3A:
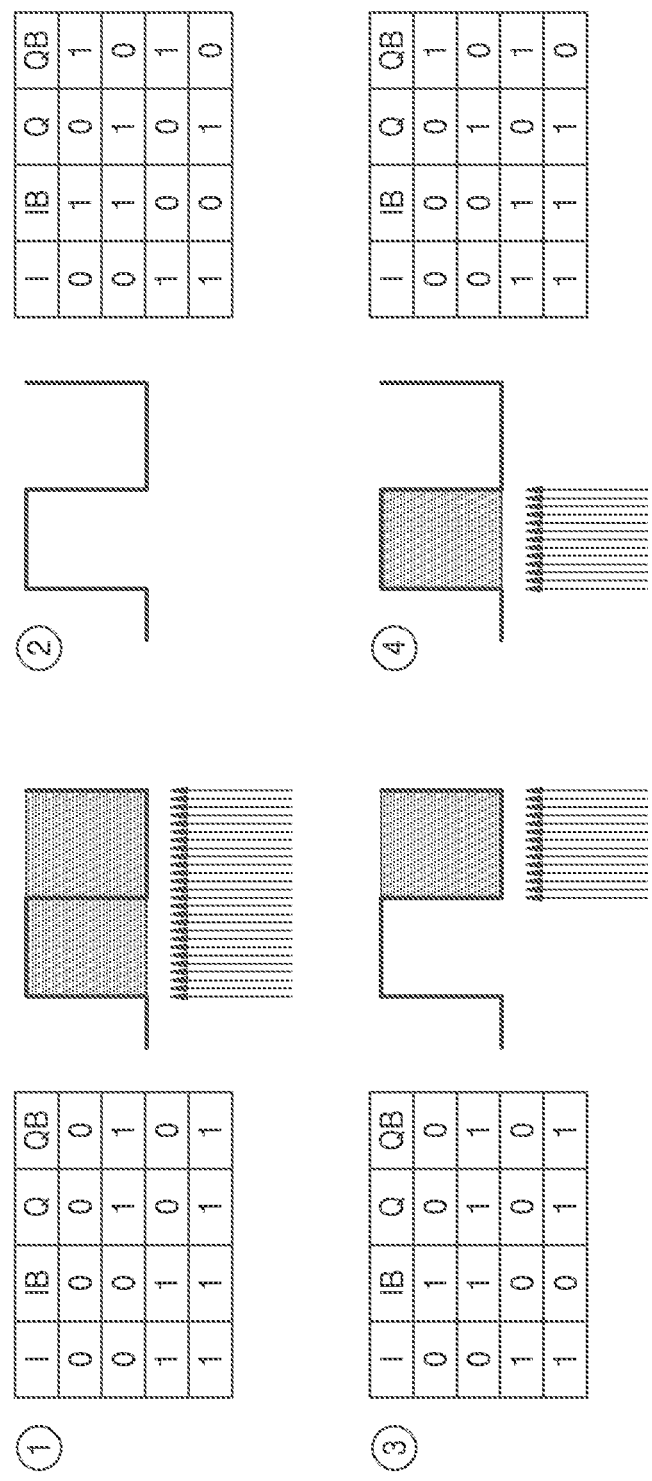
FIG. 3A illustrates scenarios of reset state dependent failure, addressed according to an example embodiment.

FIG. 3A illustrates scenarios of reset state dependent failure, according to an example embodiment. Referring to FIG. 3A, among the 16 possible reset states illustrated from steps 1-4, the set in step 2 including 4 cases where both I, IB & Q, QB pairs are differential ideally (infinite gain of data inverter) there is no reset deassertion dependent latchup failure.

At step 1 including four cases where both I, IB & Q, QB pairs are non-differential, depicts always latchup initialized states where irrespective of reset deassertion point with respect to the IQ divider input clock the output nodes will be stuck to the initialized states.

At step 3 and at step 4, including 8 cases where only one pair from I, IB & Q, QB is differential, ideally reset deassertion can be done in only half of the IQ divider input clock period where the data inverters with differential inputs are active for avoiding the latchup failure.

Figure 3B:
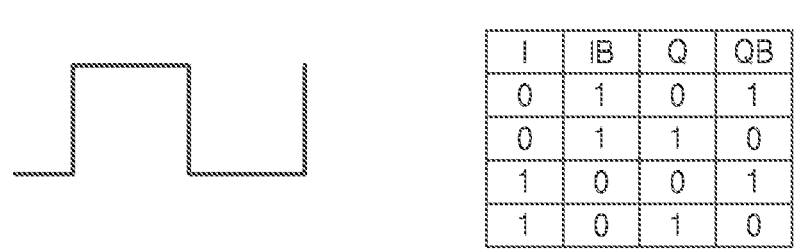
FIG. 3B and FIG. 3C illustrate scenarios of selected reset state latchup failure, addressed according to an example embodiment.
Figure 3B:
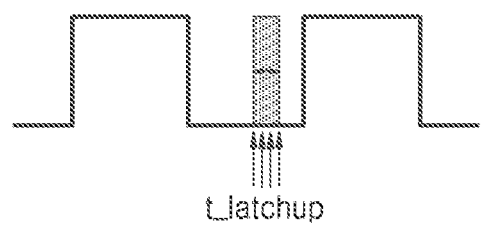
Figure 3B:
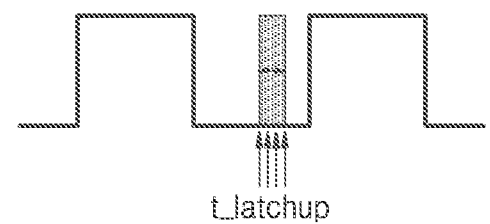
Figure 3C:
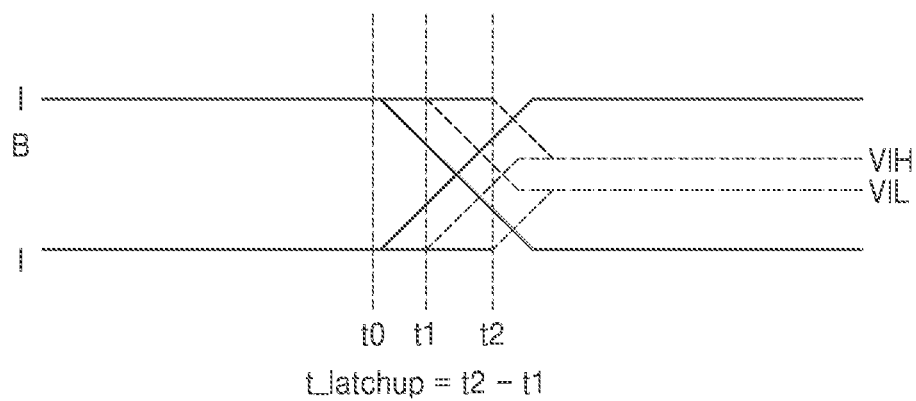

FIG. 3B and FIG. 3C illustrate a scenario of selected reset state latchup failure, according to an example embodiment. FIG. 3C illustrates the latchup window is the time window for the reset deassertion which results in the transitioned node voltages falling in the noise region of the data inverter. The noise region is determined by the Voltage Transfer Curve ("VTC"), also see FIG. 7, discussed below. Within this range of input voltage the data inverter is operating in high gain common mode sensitive region.

Figure 4:
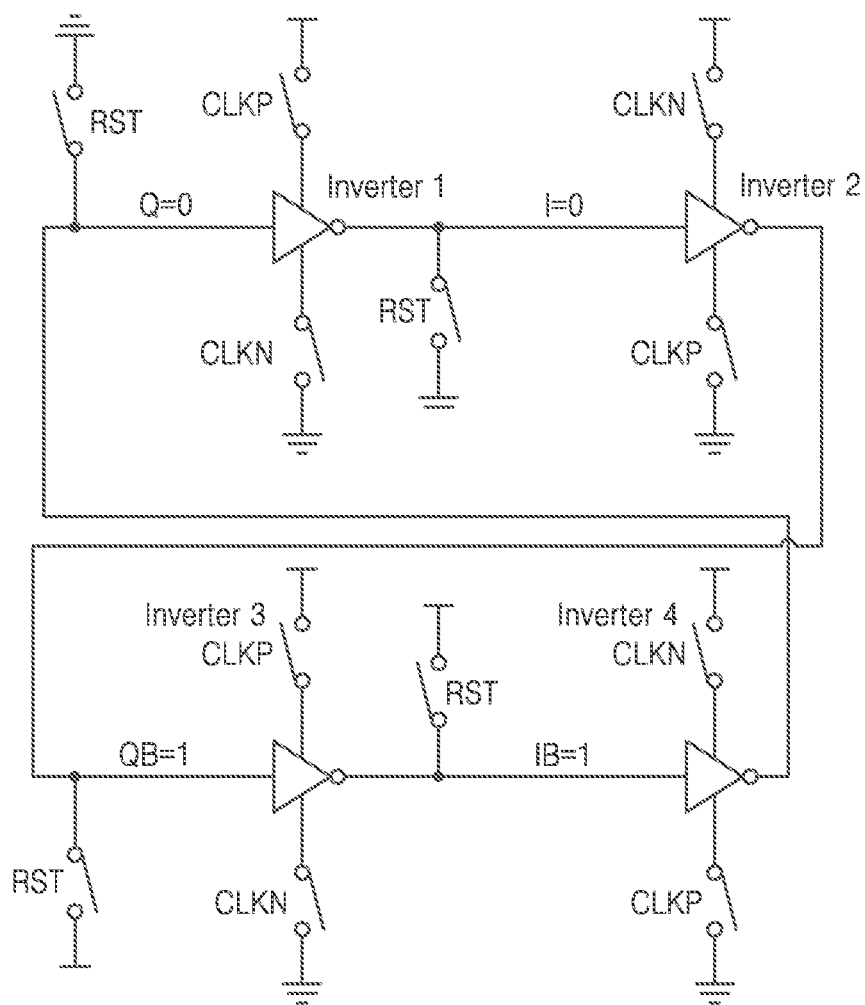
FIG. 4 is a schematic diagram illustrating an example scenario of reset control, according to an example embodiment.

FIG. 4 is a schematic diagram, illustrating an example scenario, according to an embodiment.

As seen in FIG. 4, there are four inverters namely, inverter 1, inverter 2, inverter 3 and inverter 4 with different reset/initialized state in the IQ divider 100. In the absence of clock gating the inverters 1 and 3, driving I and IB are in contention with reset switches. To hold proper an initial state in the presence of contention the reset switch size to inverter ratio is analytically chosen.

In operation, the inverters of FIG. 4 form a divide by 2 frequency divider. The input complementary clock signals are provided to the power supply rails (VDD and GND inputs) of the inverters, as shown in FIG. 4. The inverters are not simultaneously disconnected from both CLKP and CLKN and so are never in a floating potential configuration. See, for example, the waveform marked "I" in FIG. 5.

When CLKP=1 and CLKN=0, inverter 1 acts as an inverter, inverter 2 acts as a transmission gate, inverter 3 acts as an inverter and inverter 4 acts as a transmission gate. When CLKP=0 and CLKN=1, inverter 1 acts as a transmission gate, inverter 2 acts as an inverter, inverter 3 acts as a transmission gate and inverter 4 acts as an inverter.

Figure 5:
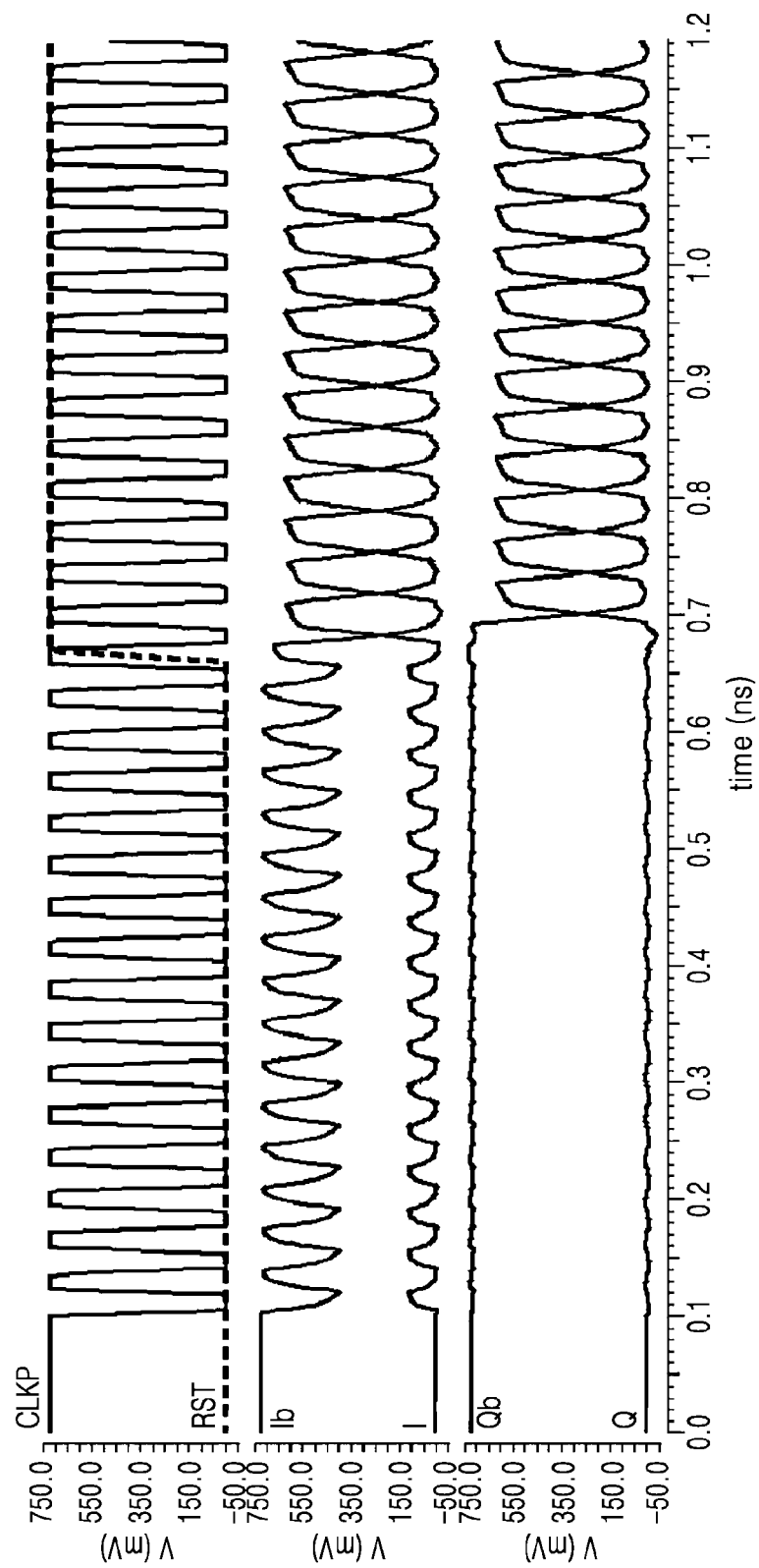

FIG. 5 are graphical diagrams, illustrating an example scenario of the proposed method for initialized reset state issue, according to an embodiment.

In an embodiment, the proposed solution discloses using a reset switch strength to driver strength ratio as a design parameter for designing the IQ divider 100. The top traces show an ideal reset signal as a dashed line and an ideal I waveform as a square wave beginning at a time of about 0.1 ns. Too small a ratio will result in loss of reset control (middle traces in FIG. 5). Too large a ratio will cause speed degradation due to increased parasitic. Thus, the reset switch strength to driver strength ratio is set to maintain proper reset initialization in presence of contention (bottom traces in FIG. 5). Thus the issue of initialized reset state is resolved.

Figure 6A:
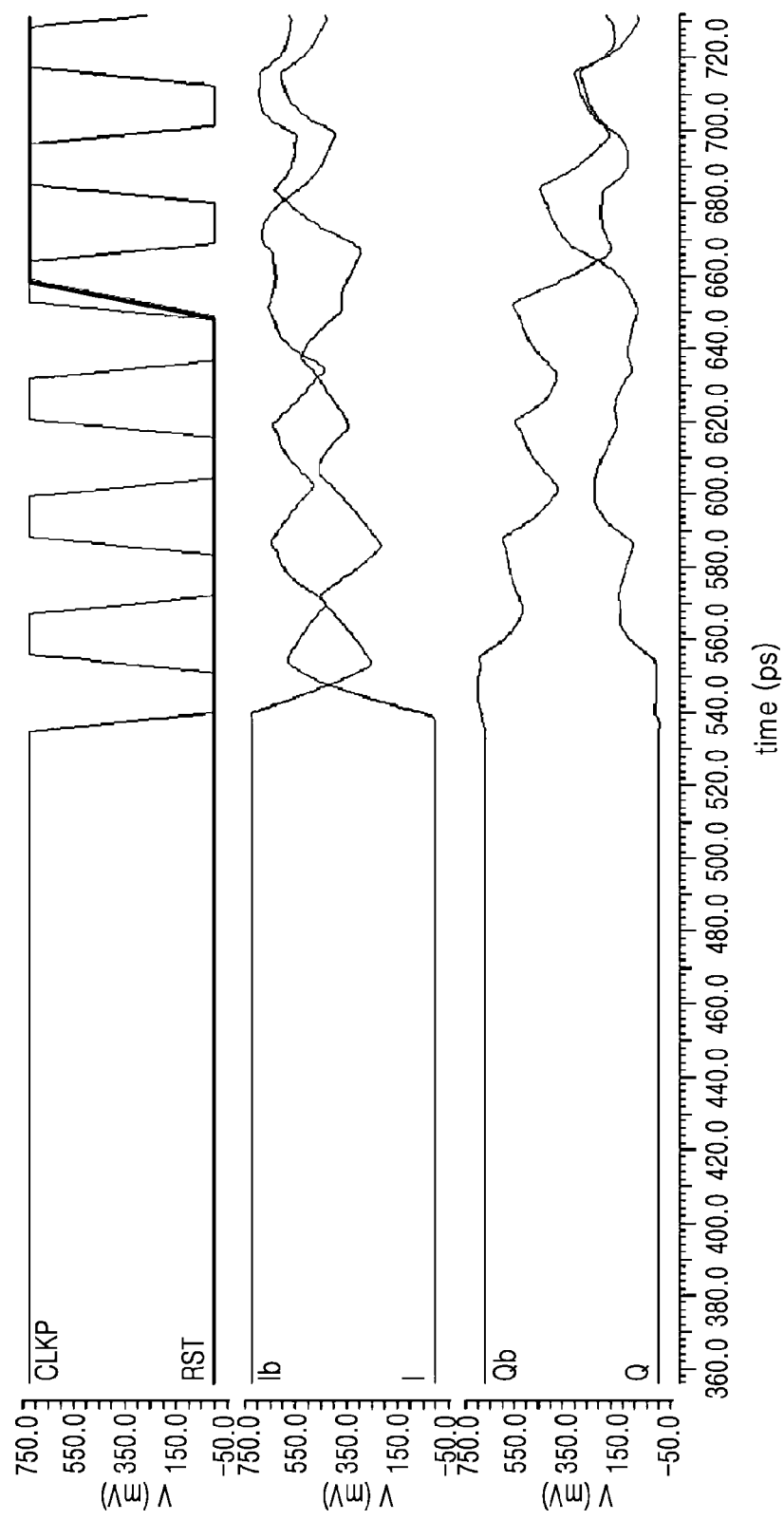

FIG. 6A and FIG. 6B are graphical diagrams, illustrating the example scenario of the proposed method for initialized reset state issue, according to an embodiment.

FIG. 6A shows the latchup failure case when a reset switch size to inverter strength ratio is small (VTC falls in noise region). When the reset is released (top waveform at about 660 ns), I and IB (middle waveforms) and Q and QB (bottom waveforms) do not provide distinct oscillating waveforms.

FIG. 6B shows the IQ divider 100 divider passing case when reset switch size to inverter strength ratio is healthy (VTC does not fall in noise region).

Referring to FIG. 6A, the latchup failure due to contention in the absence of the clock gating or the power gating is provided. FIG. 6B shows no latchup failure due to contention in in the absence of the clock gating or the power gating using analytically chosen reset switch strength/data inverter strength.

Figure 7:
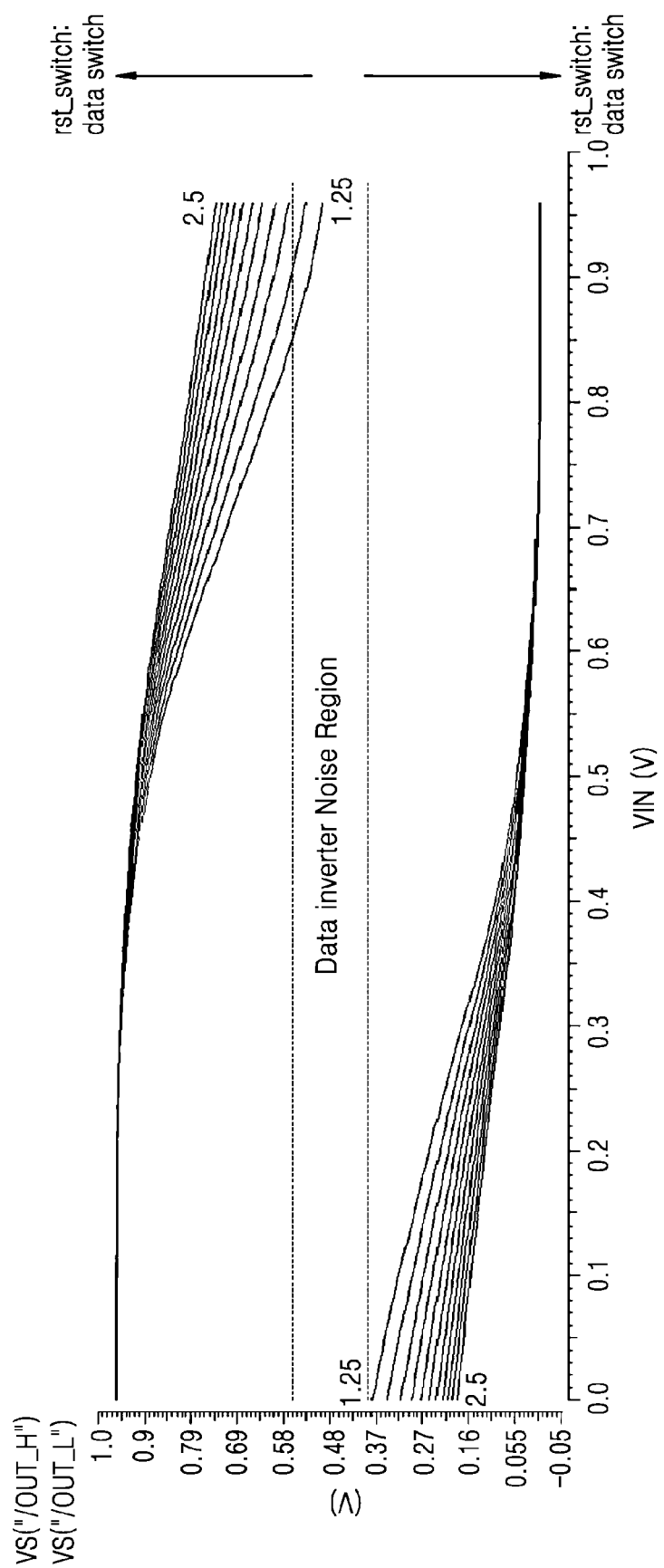

FIG. 7 is a graphical diagram, illustrating waveform of different driving nodes shows the VTC (voltage transfer curve) of inverter driving nodes I, IB, Q & QB in presence of reset switch, according to an example embodiment. FIG. 7 shows the VTC curve for data inverter as function of relative reset switch strength. FIG. 7 shows the VTC (voltage transfer curve) of inverter driving nodes I, IB, Q & QB in presence of reset switch (reset switch is ON causing contention). In an embodiment, a pull-up and a pull-down reset switch to inverter ratio is varied to obtain family of curves showing changing margins with respect to inverter noise region. Too small a ratio will result in loss of reset control (VTC goes into the inverter noise region) while too big a ratio will cause speed degradation due to increased parasitics.

Figure 8:
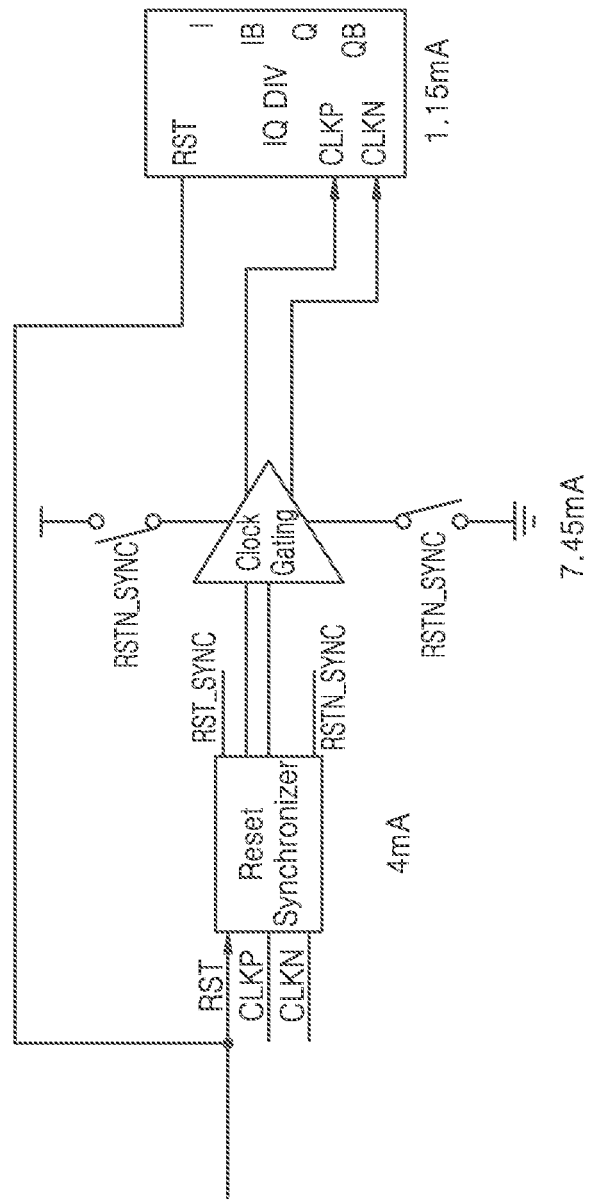
FIG. 8 illustrates power values with reset synchronizer and clock gating, according to an example embodiment.

FIG. 8 illustrates power split with reset synchronizer and clock gating, according to an example embodiment. Referring to FIG. 8, the power split shows the power cost of adding reset synchronizer (about 25% power penalty) to avoid reset deassertion latchup window and clock gating (about 50% power penalty) to avoid initialized state contention issue. Further, the clock gating solution to avoid contention requires the reset synchronizer to avoid glitch in the input clock to the IQ divider.

Figure 9:
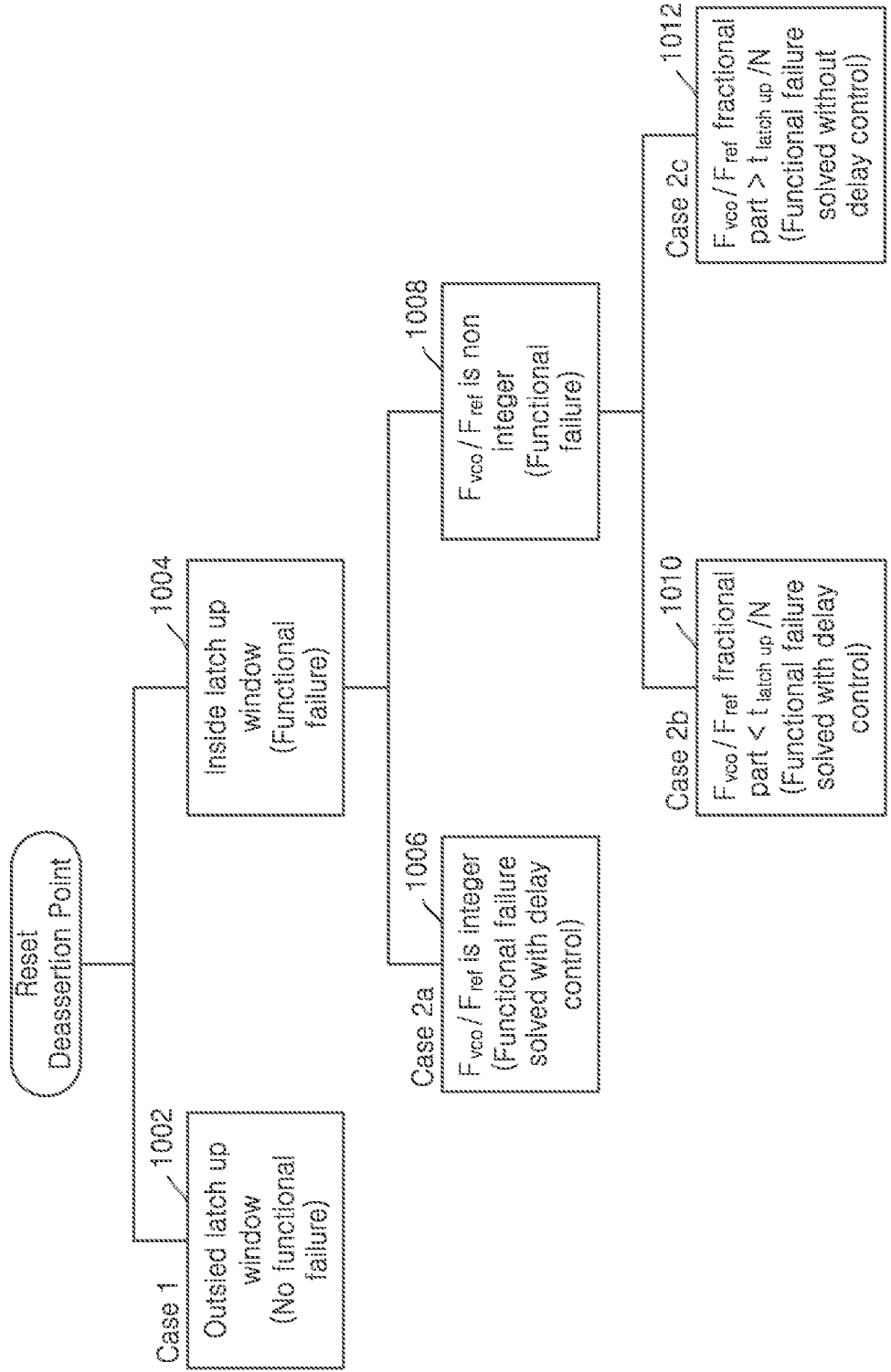
FIG. 9 illustrates a plurality of reset deassertion scenarios, according to example embodiments.

FIG. 9 illustrates a plurality of reset deassertion scenarios, according to an example embodiment. Referring to FIG. 9, the plurality of reset deassertion scenarios are provided. At step 1002, the reset deassertion point lies outside the latchup window and hence there is no functional failure encountered (case 1). At step 1004, the reset deassertion point lies within the latchup window leading to the functional failure. At step 1006, the case 2a includes the FVCO/Fref is an integer and hence the functional failure is addressed by introducing a delay control (further described in FIG. 10A and FIG. 10B).

At step 1008, the FVCO/Fref is not an integer and the subsequent functional failure scenarios are considered. At step 1010, the case 2b is considered where the fractional part of the FVCO/Fref is less than $t_{latchup}/N$ and hence the functional failure is addressed by introducing a delay control (further described in FIG. 15 and FIG. 17). At step 1012, the case 2c is considered where the fractional part of the FVCO/Fref is greater than $t_{latchup}/N$ and the functional failure is addressed without the delay control (further described in FIG. 12A to FIG. 14B and FIG. 16).

Figure 10A:
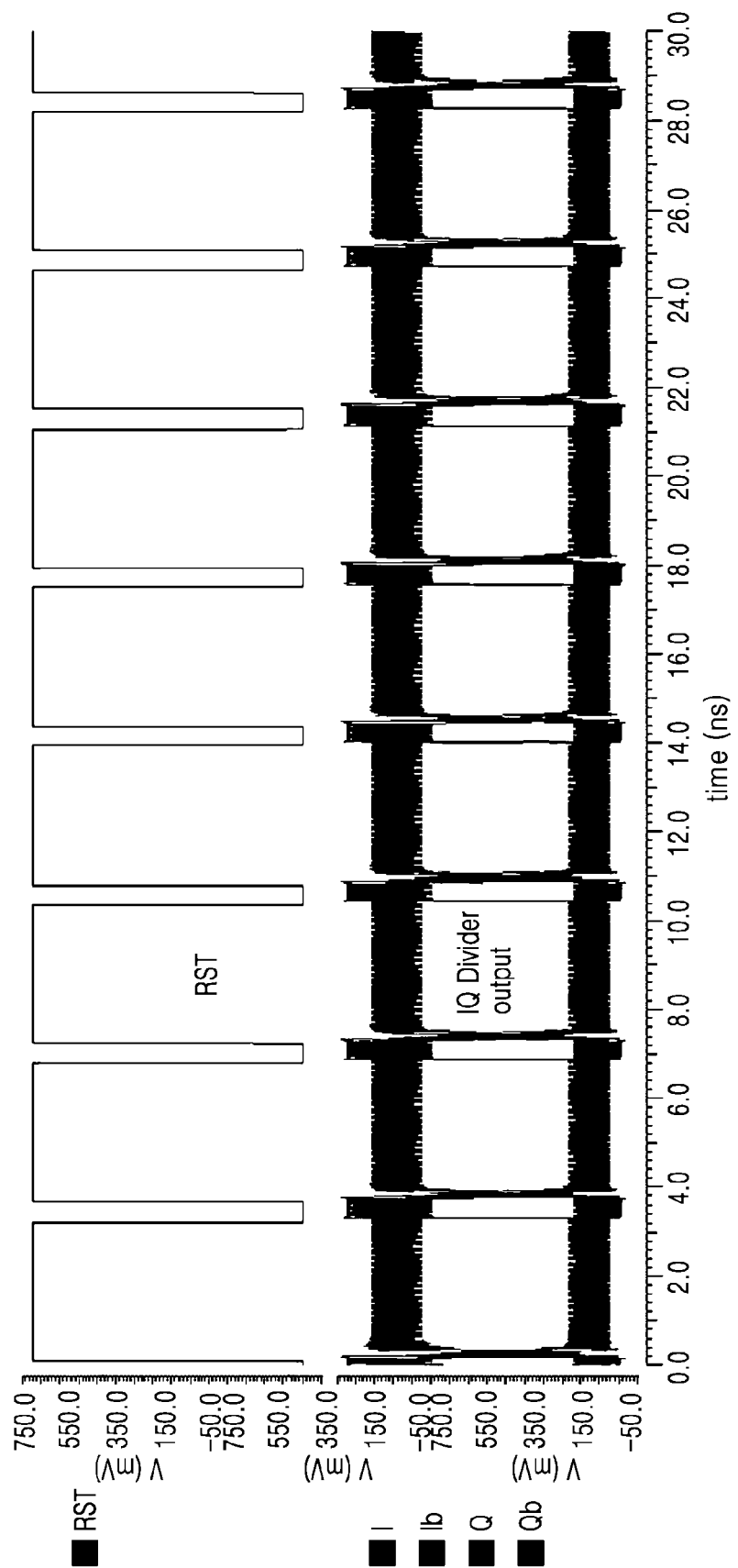
FIGS. 10A to 16B illustrate solutions to the plurality of reset deassertion scenarios, according to an example embodiments.
Figure 10B:
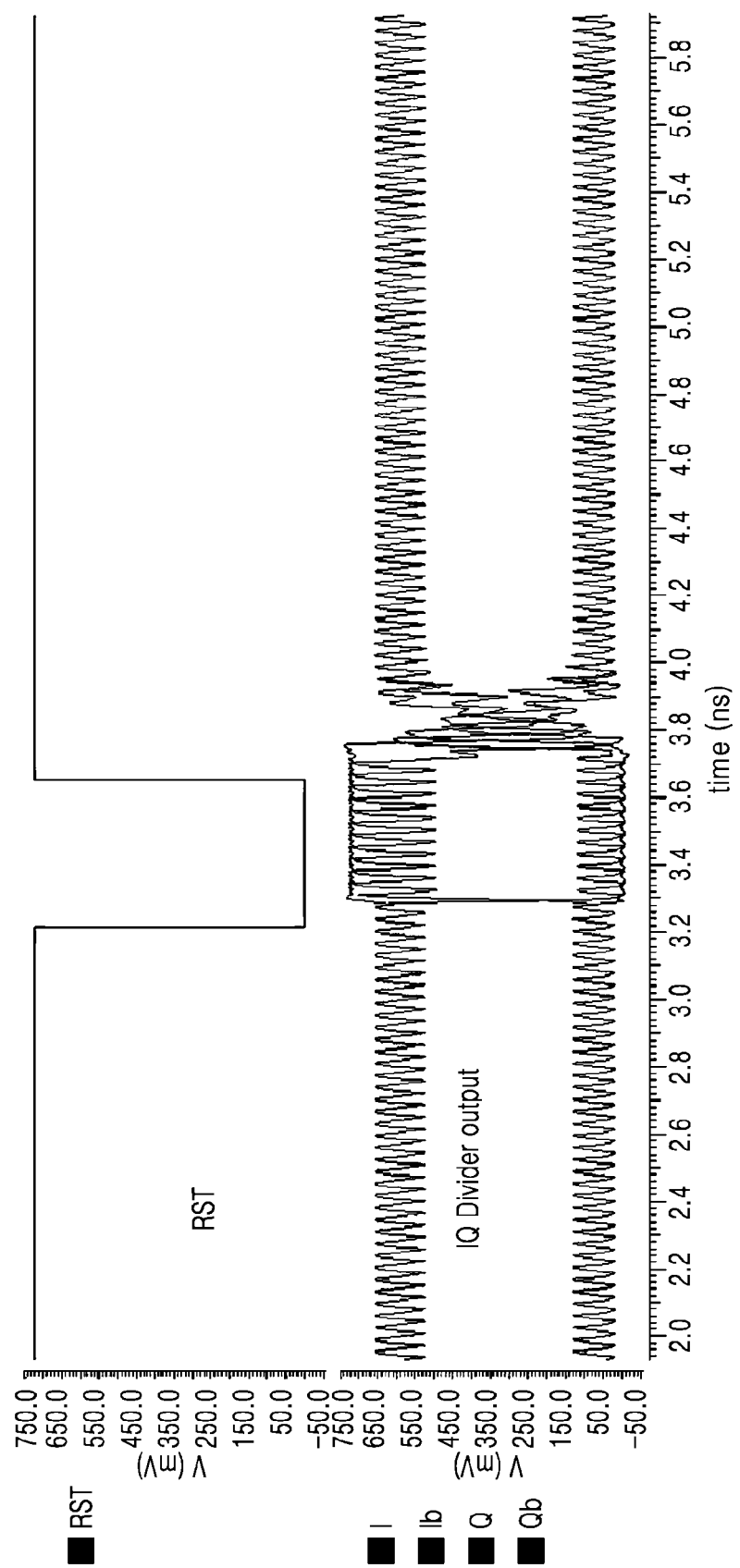

FIGS. 10A to 16B illustrate solutions to the plurality of reset deassertion scenarios, according to example embodiments. Referring to FIG. 10A and FIG. 10B (zoomed version of FIG. 10A), in an example, the frequency of the VCO clock FVCO=100*FREF. For integer frequency relation between the Ref clock and the vco clock, initial failure will not be resolved without the delay control technique. In the plot shown the delay control phase is yet to begin. Here, the FVCO/Fref is integer and hence the functional failure is addressed by introducing a delay control. Here, the delay is added after waiting for certain number of the reference cycles and then the RESET is moved out of the latchup window.

Figure 11A:
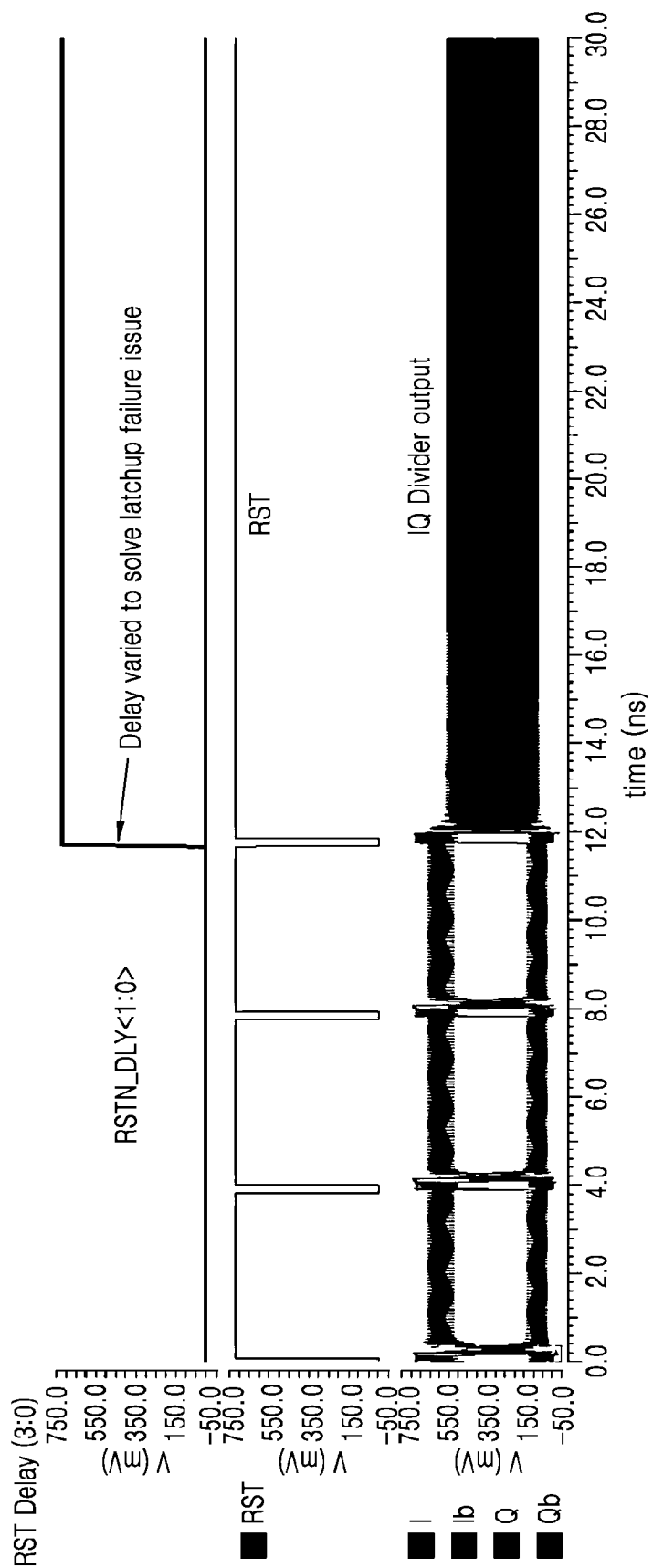
Figure 11B:
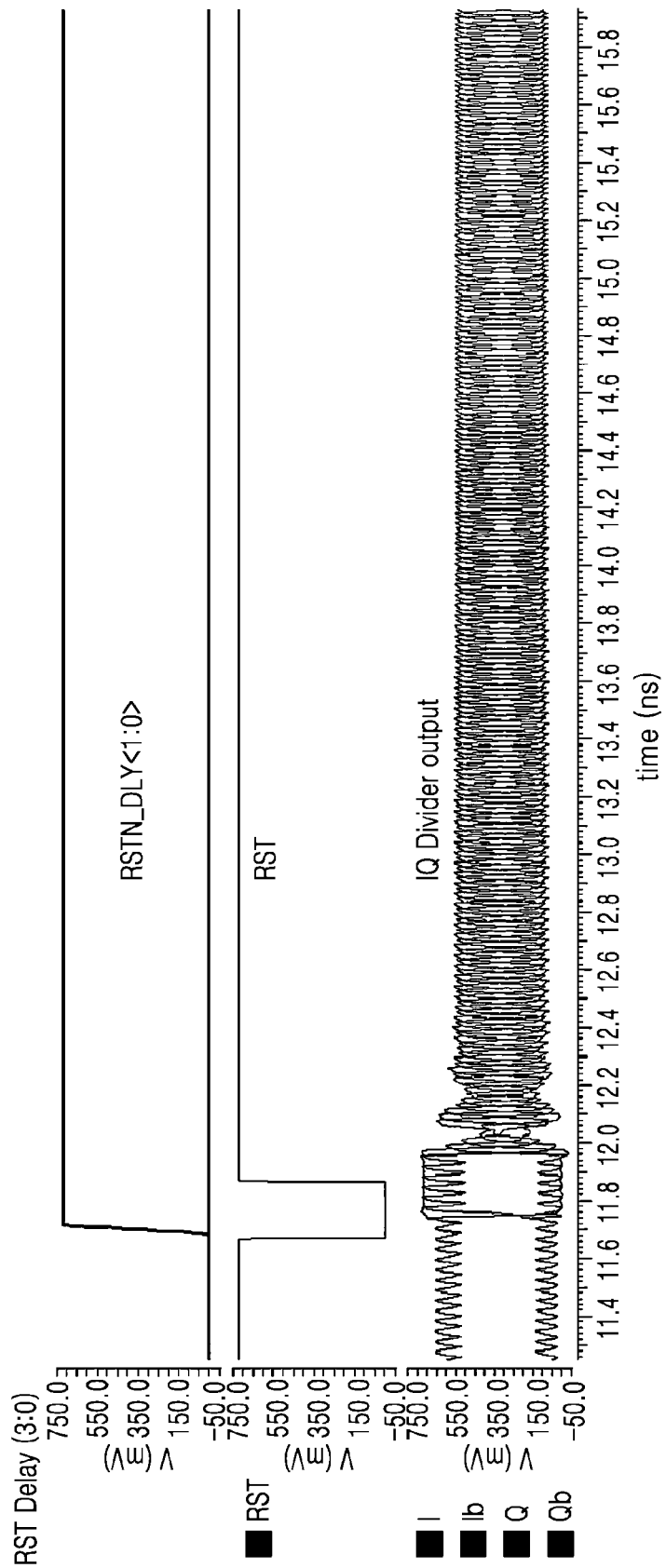

Similarly, referring to FIG. 11A and FIG. 11B (zoomed version of FIG. 12A), in an example, the frequency of the VCO clock FVCO=100*FREF with the delay. Here, the dynamic delay control solves the functional failure due to reset deassertion in the latchup window within 3 cycles.

Figure 12A:
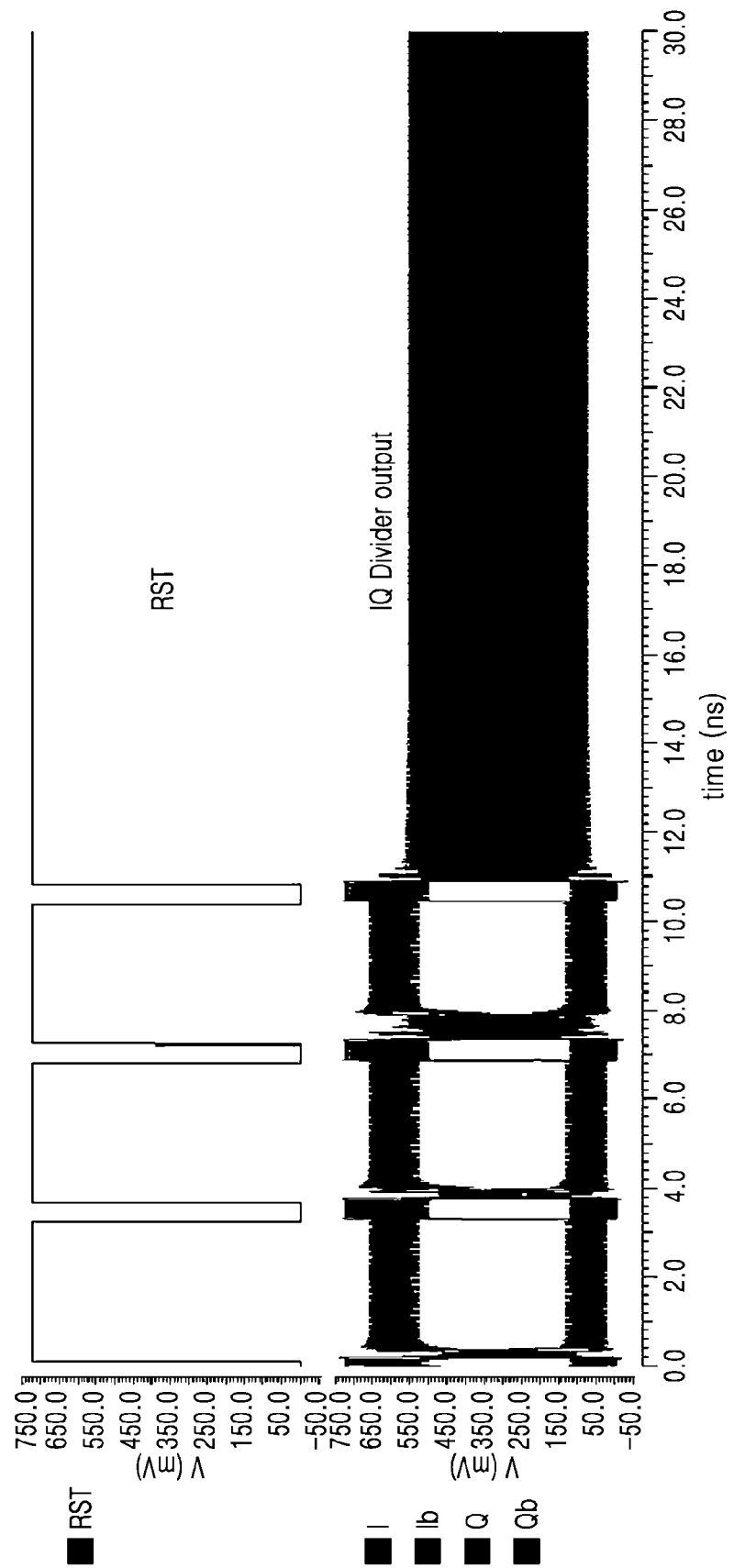
Figure 12B:
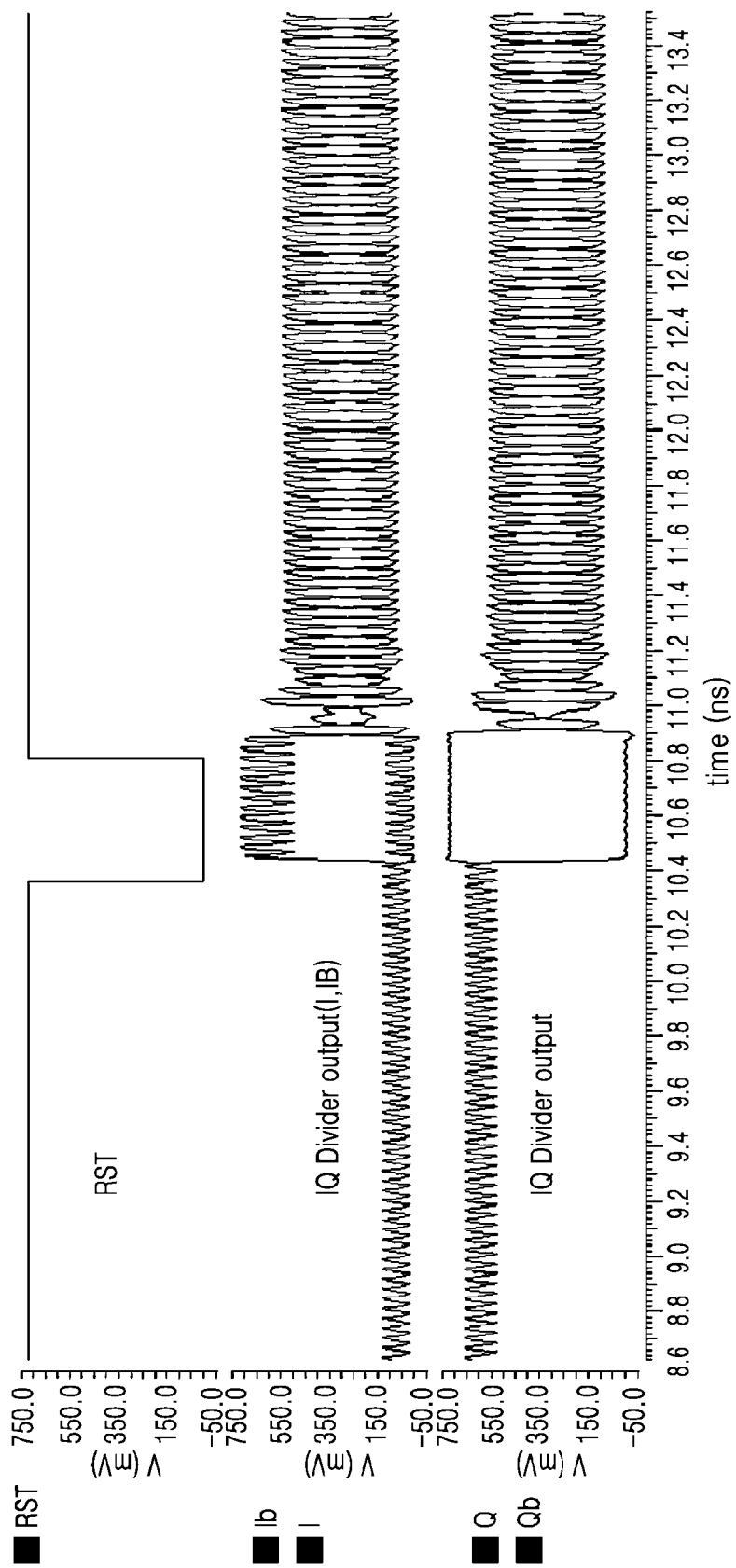

Referring to FIG. 12A and FIG. 12B (zoomed version of FIG. 12A), in an example, the frequency of the VCO clock FVCO=100.1*FREF. Here FVCO/Fref is fractional and the fractional part of the FVCO/Fref is greater than the $t_{latchup}/N$ (number derived from initial value) and the functional failure is addressed without the delay control. For the non-integer factor between the VCO and the ref clocks the functional failure is resolved in finite no. of ref cycles (N) depending on the fractional part and the latchup window width.

Figure 13A:
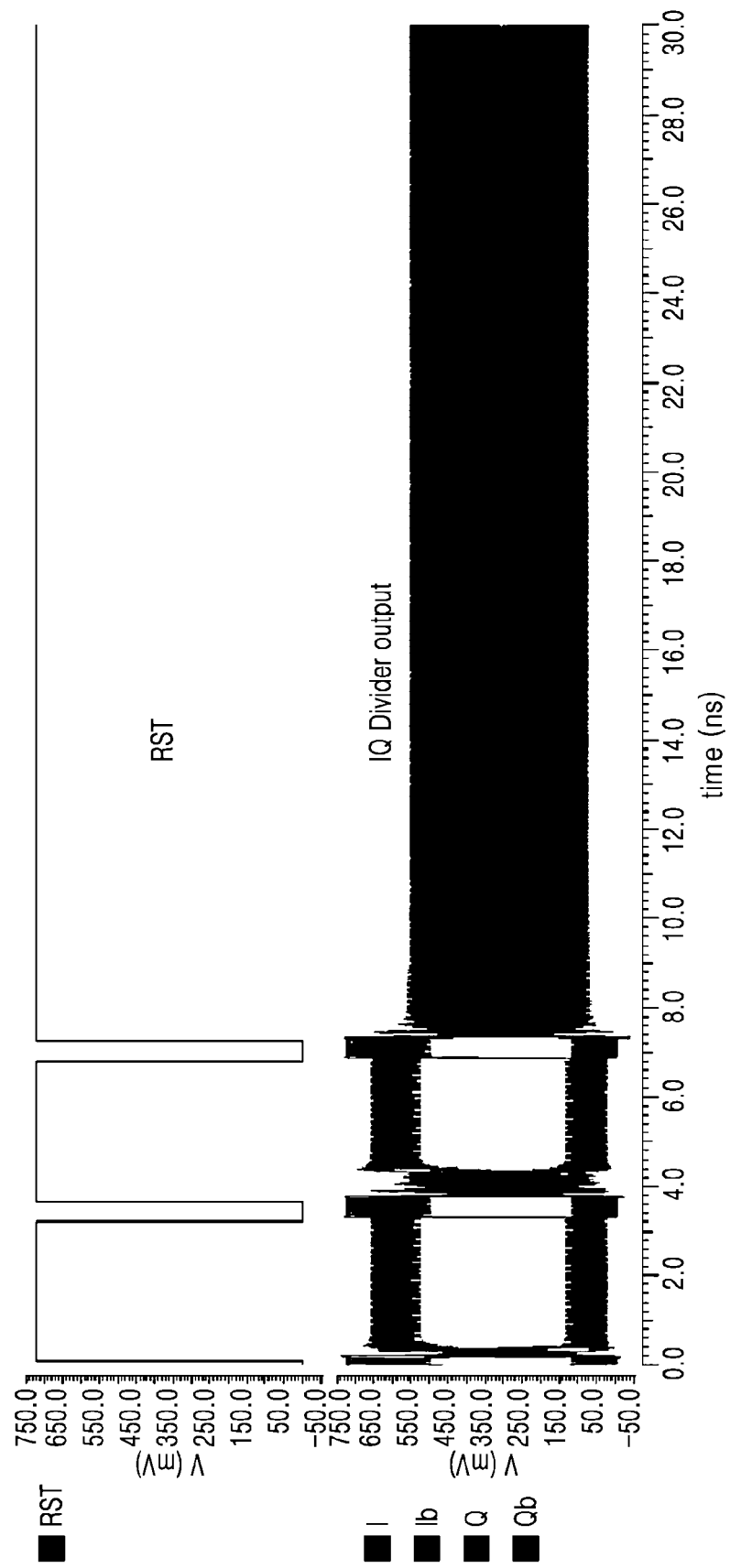
Figure 13B:
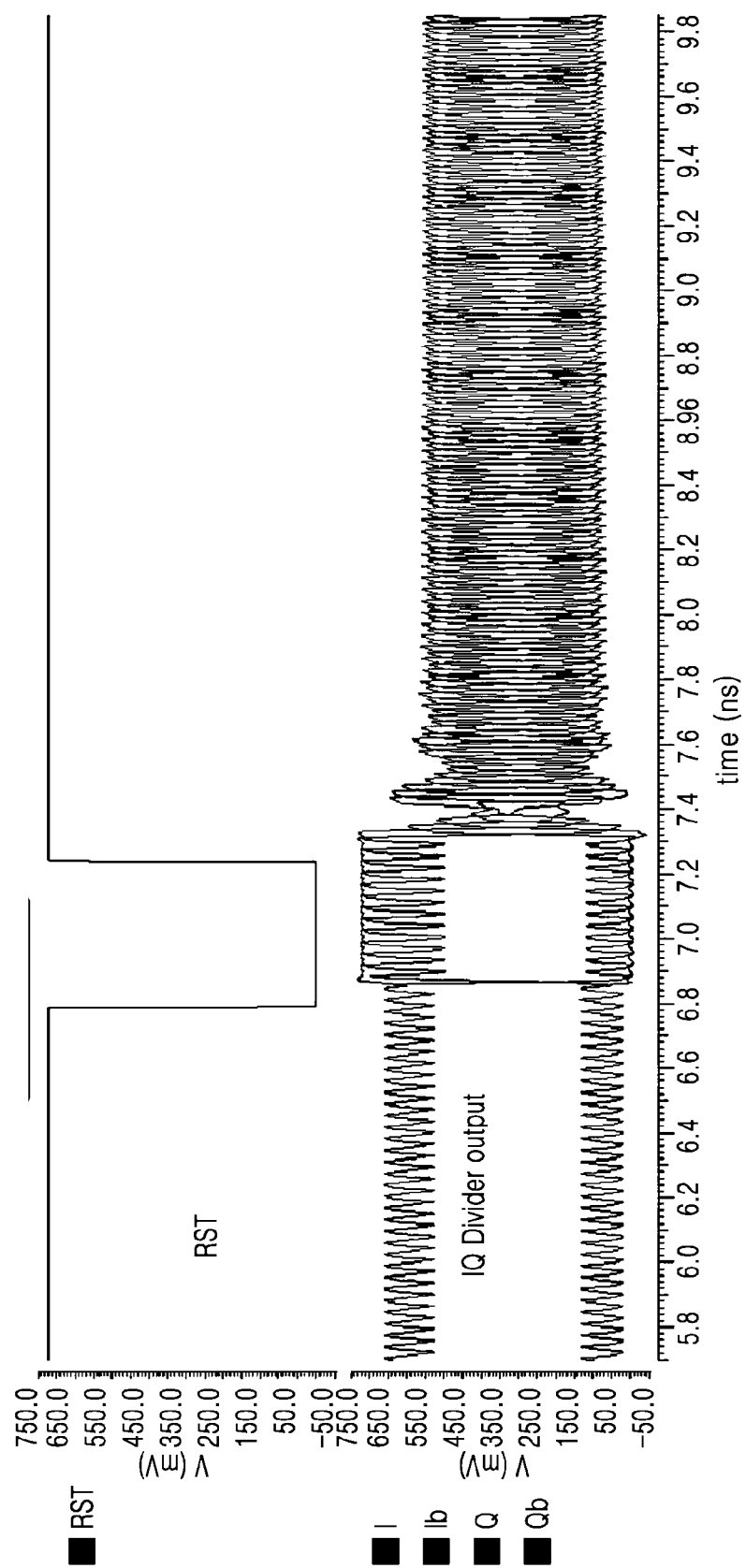
Figure 14A:
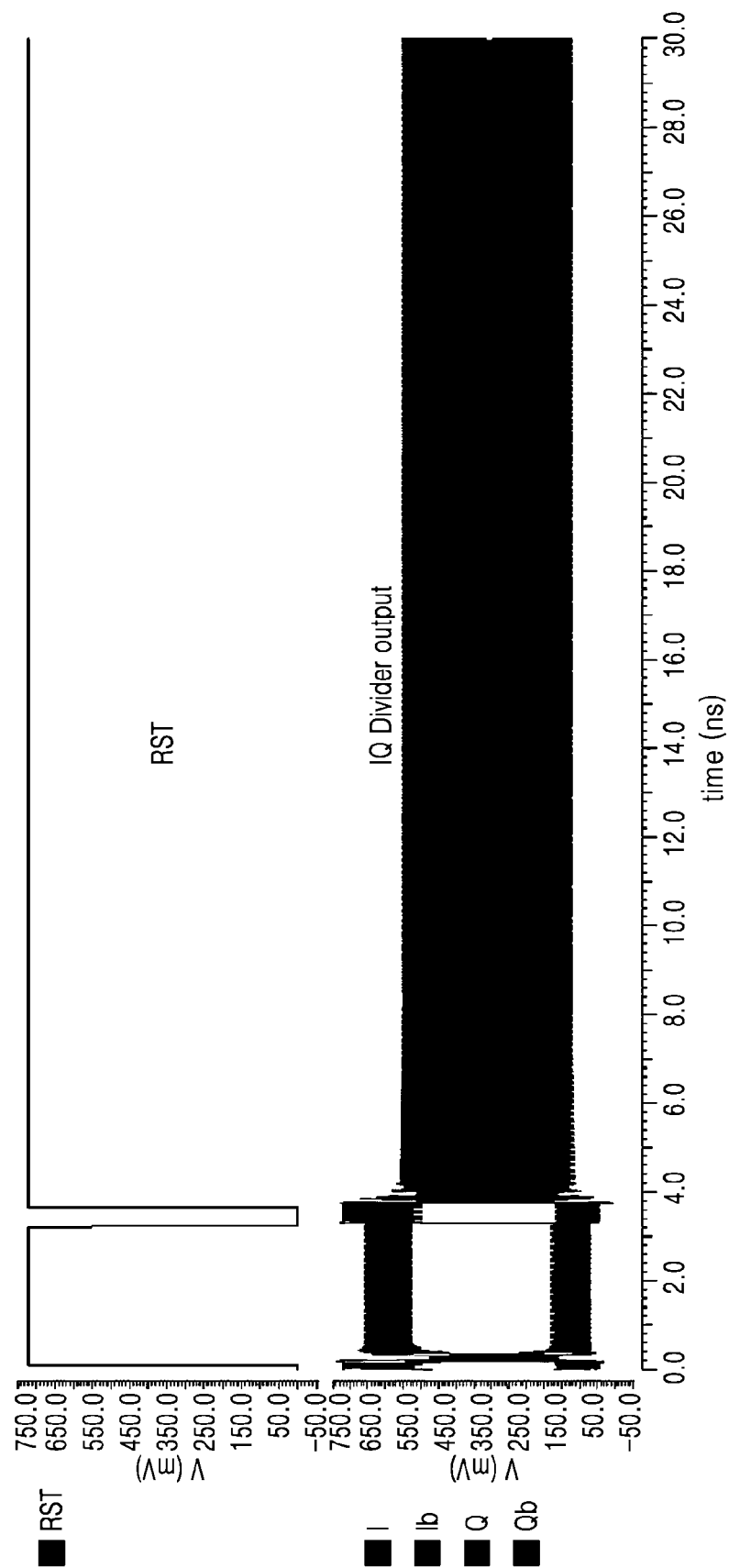
Figure 14B:
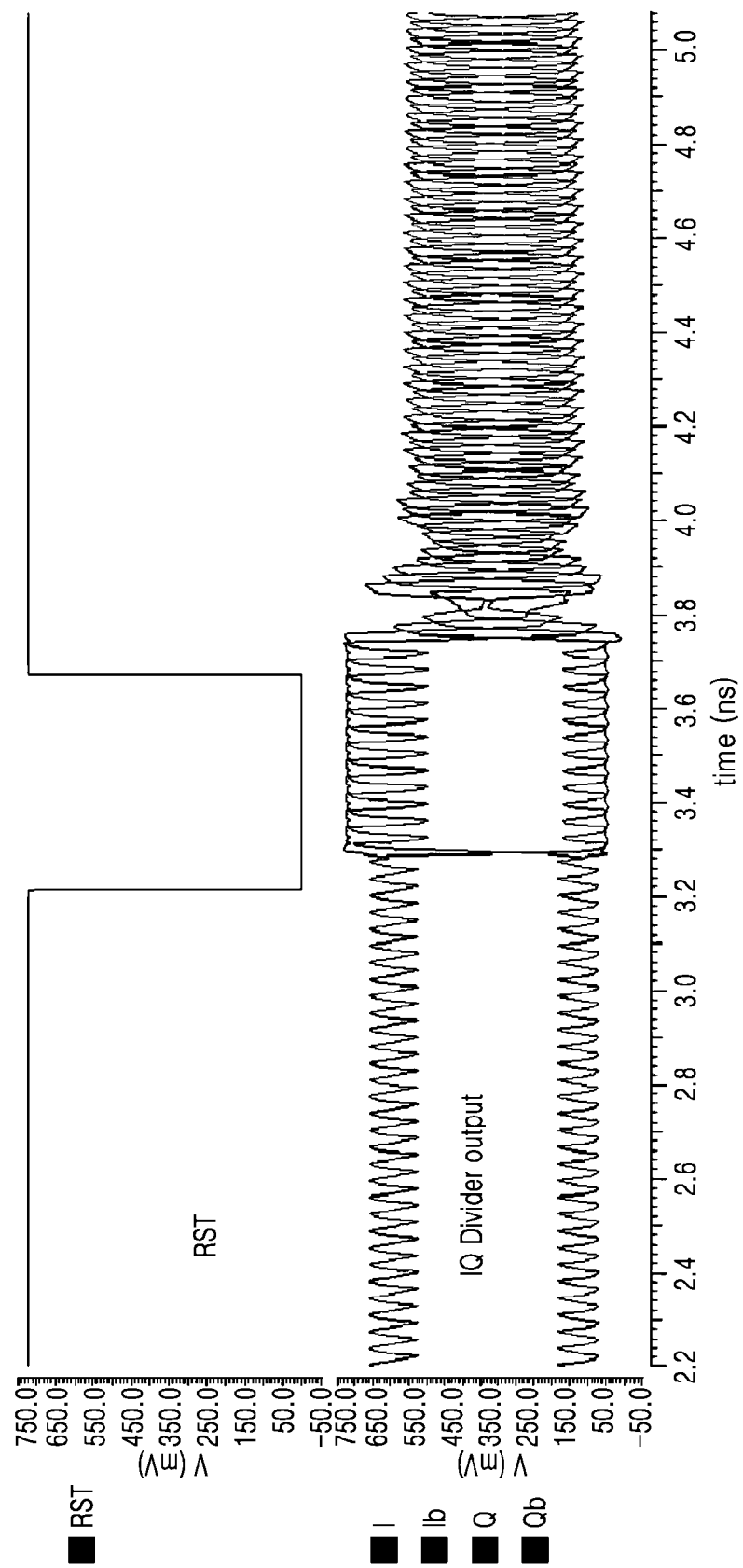

Similarly, FIG. 13A and FIG. 13B (zoomed version of FIG. 13A), for example, the frequency of the VCO clock FVCO=100.2*FREF and FIG. 14A and FIG. 14B (zoomed version of FIG. 14A), in an example, the frequency of the VCO clock FVCO=100.5*FREF.

Figure 15:
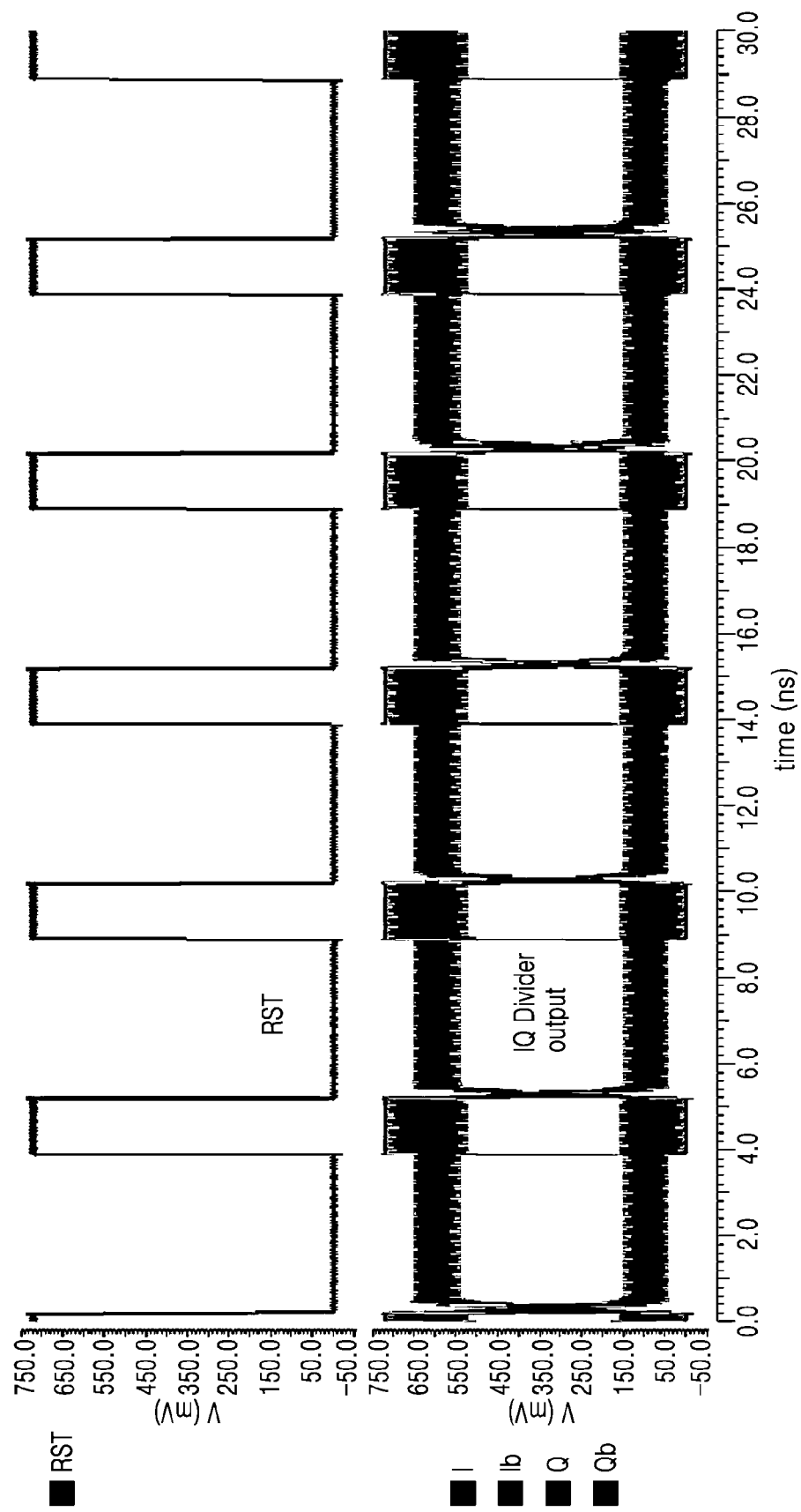

Referring to FIG. 15, in an example, the frequency of the VCO clock FVCO=100.02*FREF with N=2. Here FVCO/Fref is fractional and the fractional part of the FVCO/Fref i.e., Δ is less than the $t_{latchup}/N$ (number derived from initial value). For Δ <$t_{latchup}/N$ solution in N+1 cycles with delay control. In plot shown the algorithm has entered delay control phase. In FIG. 15, the case 2B failure scenario is not solved without the delay control logic which is part of the proposed solution.

Figure 16A:
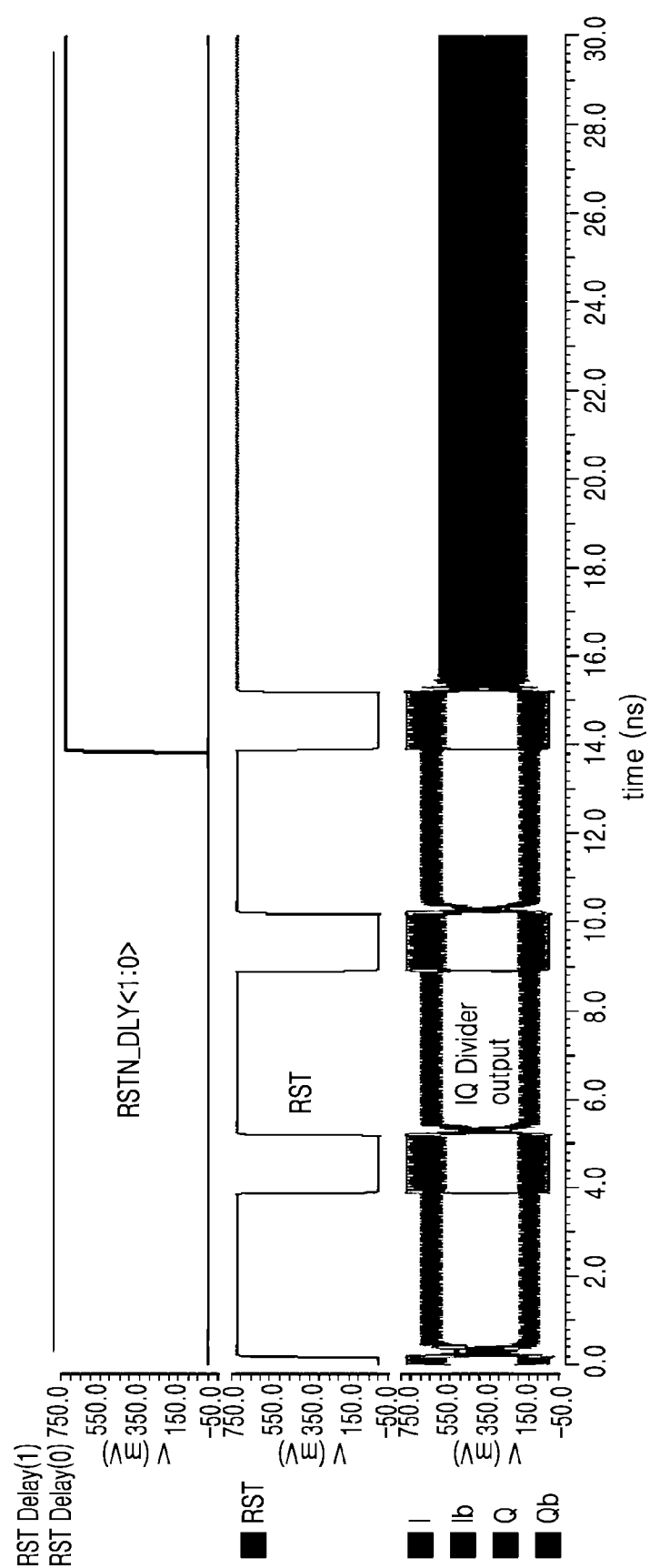
Figure 16B:
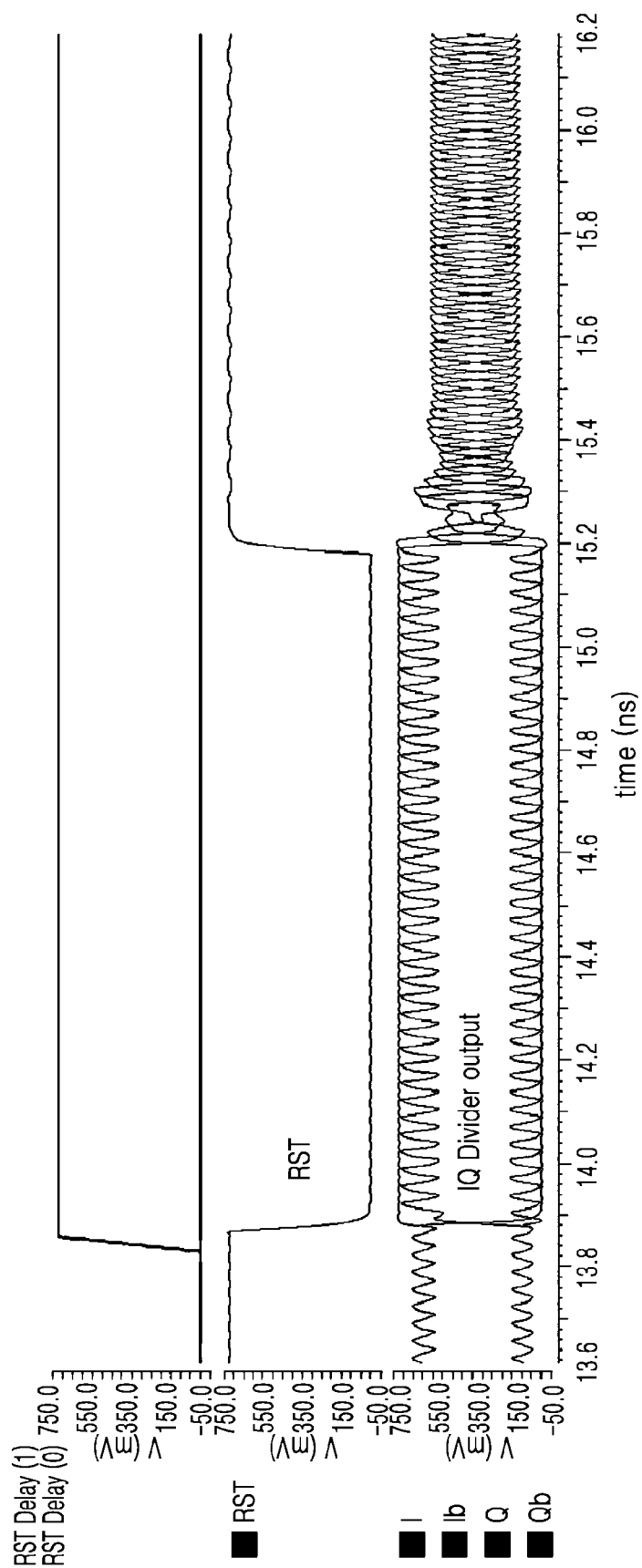

Referring to FIG. 16A and FIG. 16B (zoomed version of FIG. 16A) illustrate the waveform for FVCO=150.02*FREF with N=2. Here, the case 2B failure scenario is solved using the proposed solution.

Figure 17A:
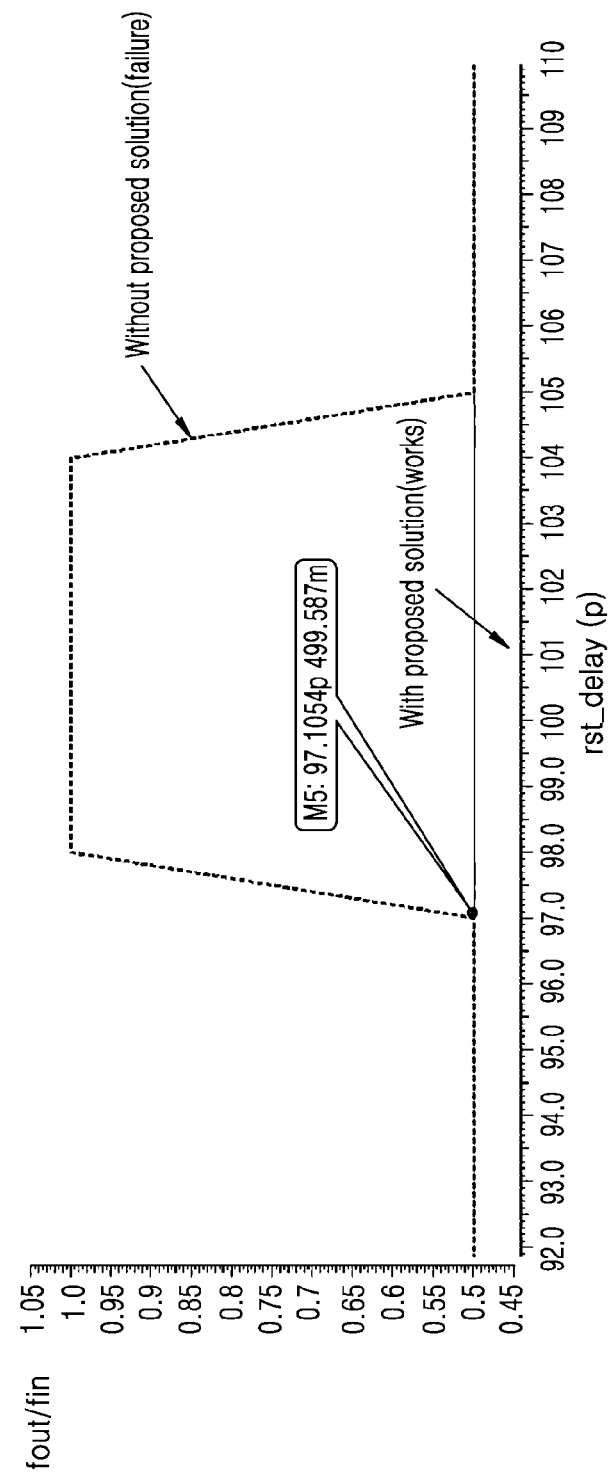
FIGS. 17A to 17D illustrate latchup failure window (reset deassertion sweep), addressed according to example embodiments.
Figure 17B:
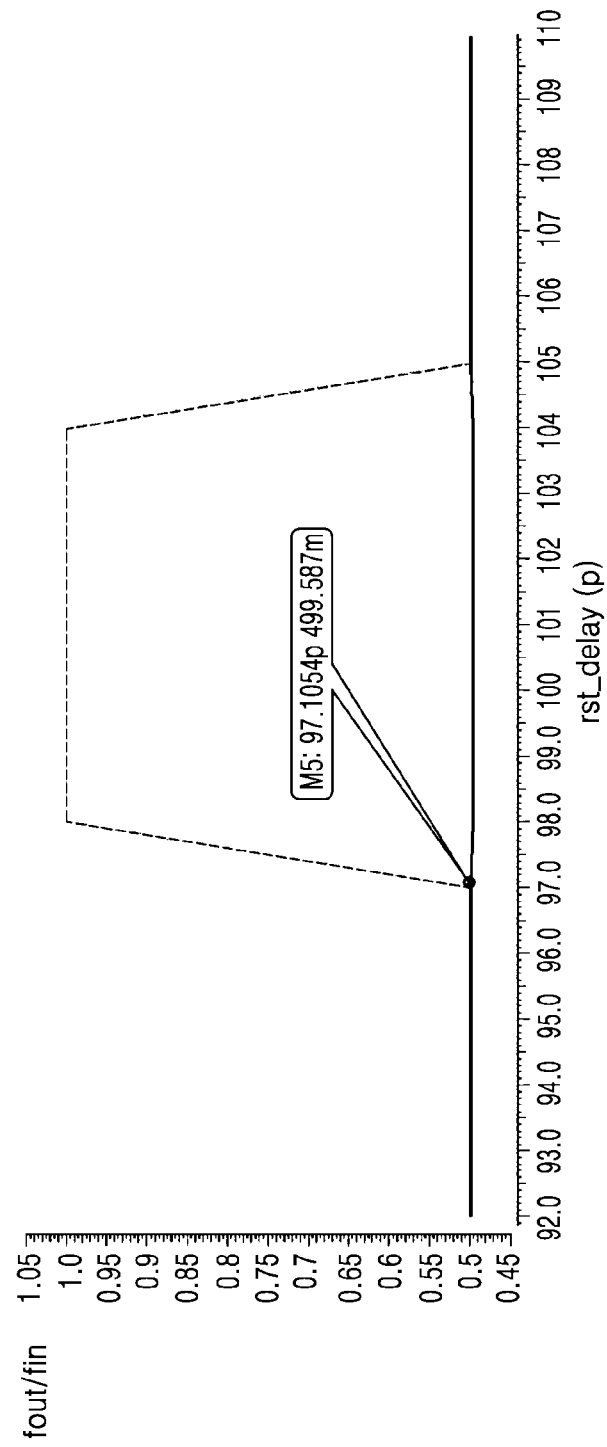
Figure 17C:
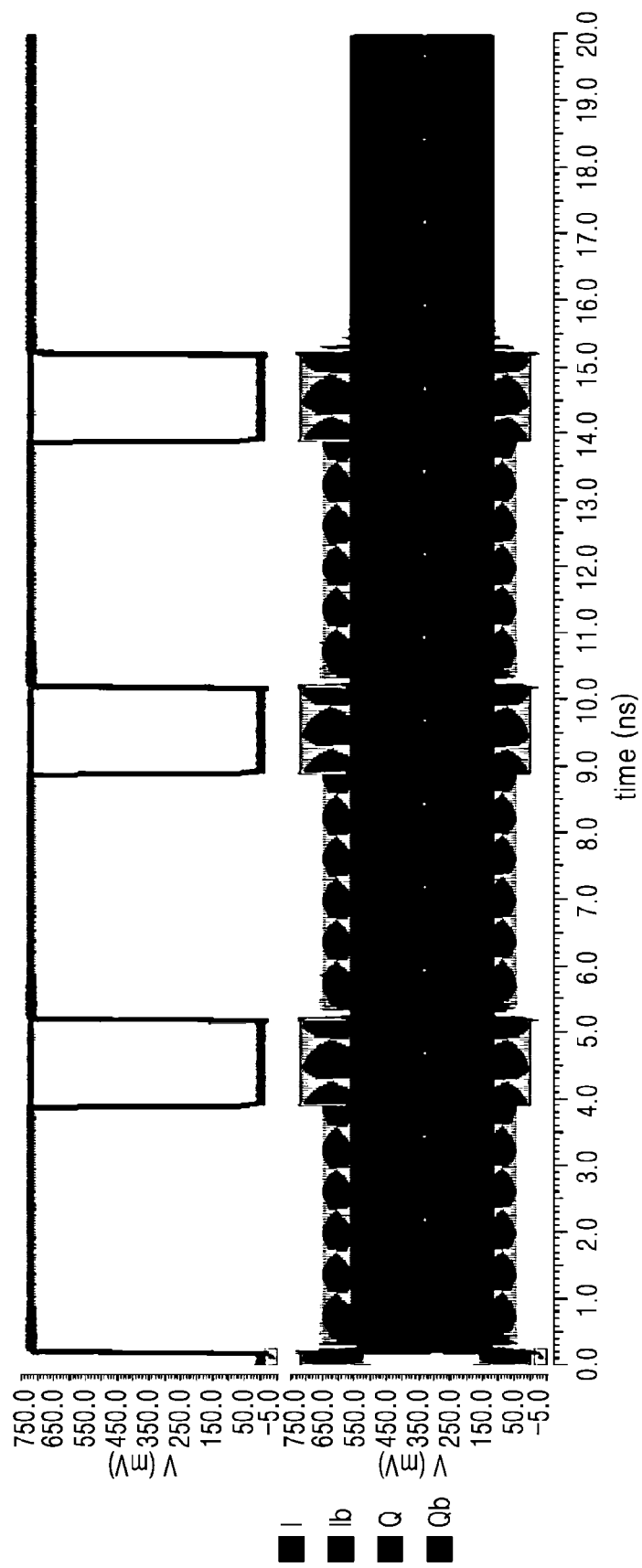
Figure 17D:
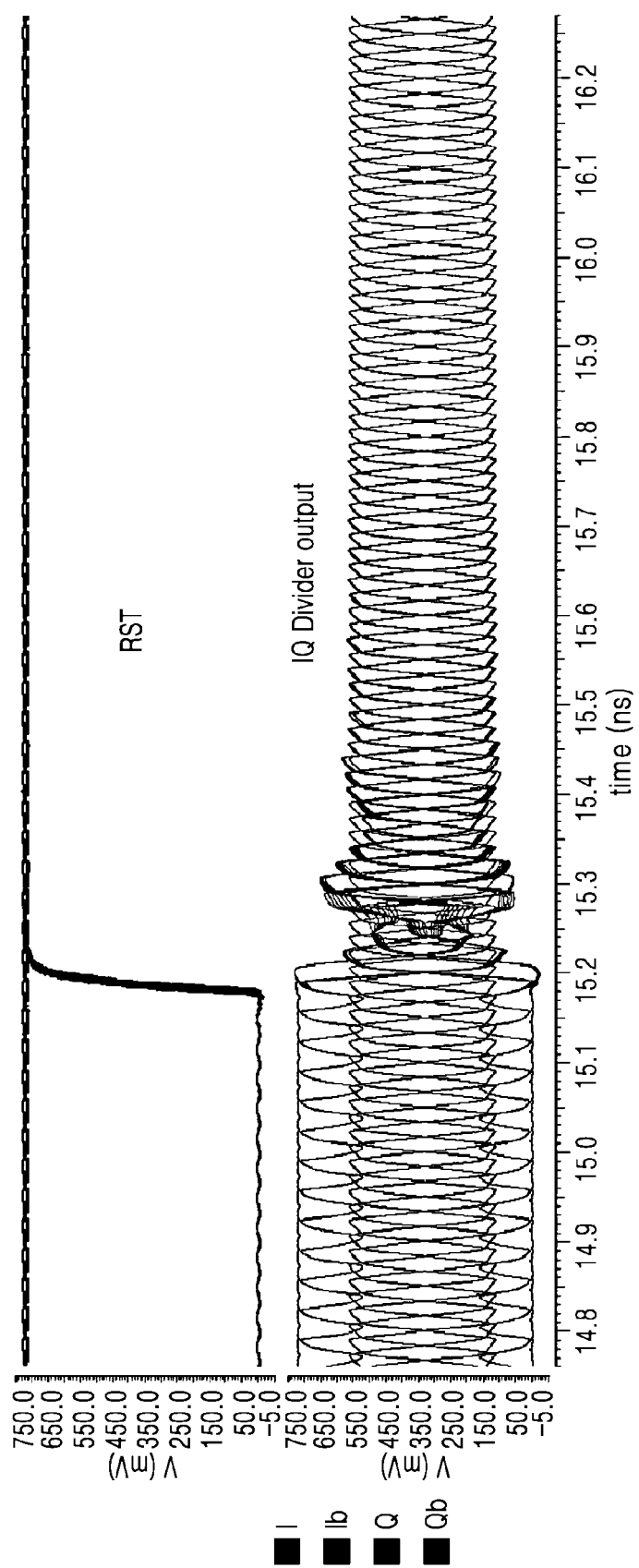

FIGS. 17A to 17D illustrate various scenarios of latchup window (reset deassertion sweep), according to an example embodiment. FIG. 17A and FIG. 17B, illustrate the reset latchup window without the proposed solution (dotted plot 97 pS to 105 pS) and with proposed solution (solid plot no latchup window). FIG. 17C and FIG. 17D show the proper functioning of the IQ divider when reset is initially at the latchup window points with the proposed solution.

The above-described embodiments of the system 1000 may be implemented by a processor. In addition, the method of controlling the reset signal 101 may be stored in a memory in the form of an instruction, and the processor may be operated by the instruction related to the method of controlling the reset signal 101.

The foregoing description of example embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the scope of the embodiments as described herein.

What is claimed is:
1. A system comprising:
an IQ divider configured to output a IQ divider output clock;
an input configured to receive a reference clock;

a failure sensing circuit configured to sense a failure in the IQ divider output clock, the failure sensing circuit comprising an automatic frequency calibration (AFC) logic; and a control circuit configured to control a reset signal provided to the IQ divider, based on an output of the failure sensing circuit corresponding the failure sensed by the failure sensing circuit.

2. The system of claim 1, wherein the control circuit comprises:
 a counter,
 a delay control element,
 a multiplexer, and
 a variable delay element.

3. The system as claimed in claim 2, wherein the failure sensing circuit is further configured to check an output frequency of the IQ divider output clock with respect to a frequency of the reference clock.

4. The system as claimed in claim 3, wherein the failure sensing circuit further comprises an internal counter that is triggered based on the IQ divider output clock.

5. The system as claimed in claim 4, wherein the failure sensing circuit is further configured to sense the failure by determining a presence of the IQ divider output clock based on a frequency measurement using the counter, wherein the counter is incremented by the IQ divider output clock.

6. The system as claimed in claim 2, wherein the control circuit is further configured to determine a failure scenario based on an output of the AFC logic.

7. The system as claimed in claim 6, wherein the control circuit is further configured to control the reset signal based on the failure scenario.

8. The system as claimed in claim 6, wherein the failure scenario comprises one of:
 a) a first ratio of a first frequency of an input clock to the IQ divider and a second frequency of the reference clock being a first integer;
 b) a second ratio of the first frequency of the input clock and the second frequency of the reference clock is a first non-integer number, wherein a first fractional portion of the second ratio being less than a latch-up window threshold, wherein the latch-up window threshold is determined as $t_{latchup}/N$, and wherein N is a number of reference cycles allowed to pass before activating the delay control element; or
 c) a third ratio of the first frequency of the input clock and the second frequency of the reference clock being a second non-integer number, wherein a second fractional portion of the third ratio is greater than the latch-up window threshold.

9. The system as claimed in claim 8, wherein the control circuit is further configured to use a delay control function for the failure scenario corresponding to each of:
 a) the first ratio is the first integer, and
 b) the second ratio wherein the first fractional portion is less than the latch-up window threshold.

10. The system as claimed in claim 2, wherein the control circuit is further configured to:
 reassert the reset signal asynchronously in the IQ divider to restore an initial condition of the IQ divider;
 deassert the reset signal on a next positive edge of the reference clock; and
 position the reset signal with respect to an input clock of the IQ divider based on a failure scenario.

11. A method of dynamically controlling a reset signal for an IQ divider by a system, the method comprising:

monitoring an output frequency of the IQ divider with respect to an input reference clock frequency of a reference clock;

detecting a failure in the IQ divider based on the monitored output frequency of the IQ divider; and dynamically controlling, the reset signal based on the detected failure.

12. The method as claimed in claim 11, wherein dynamically controlling reset signal comprises:
 reasserting the reset signal asynchronously in the IQ divider to restore an initial condition of the IQ divider;
 deasserting the reset signal on a next positive edge of the reference clock;
 determining a failure scenario associated with the failure; and
 position the reset signal with respect to an input clock of the IQ divider based on the failure scenario.

13. The method as claimed in claim 12, wherein the system comprises:
 the IQ divider;
 an input configured to receive the reference clock;
 a failure sensing circuit configured to sense the failure, the failure sensing circuit comprising an AFC logic; and
 a control circuit configured to control the reset signal based on the control circuit, comprising:
  a counter,
  a delay control element,
  a multiplexer, and
  a variable delay element.

14. An apparatus comprising:
 a memory storing one or more instructions; and
 a processor for executing one or more instructions stored in the memory;
 wherein the processor is configured to implement:
  an IQ divider configured to output a IQ divider output clock;
  an input configured to receive a reference clock;
  a failure sensing circuit configured to sense a failure in the IQ divider output clock, the failure sensing circuit comprising an automatic frequency calibration (AFC) logic; and
  a control circuit configured to control a reset signal provided to the IQ divider, based on an output of the failure sensing circuit corresponding the failure sensed by the failure sensing circuit.

15. The apparatus of claim 14, wherein the control circuit comprises:
 a counter,
 a delay control element,
 a multiplexer, and
 a variable delay element.

16. The apparatus as claimed in claim 15, wherein the failure sensing circuit is further configured to check an output frequency of the IQ divider output clock with respect to a frequency of the reference clock.

17. The apparatus as claimed in claim 16, wherein the failure sensing circuit further comprises an internal counter that is triggered based on the IQ divider output clock.

18. The apparatus as claimed in claim 17, wherein the failure sensing circuit is further configured to sense the failure by determining a presence of the IQ divider output clock based on a frequency measurement using the counter, wherein the counter is incremented by the IQ divider output clock.

19. The apparatus as claimed in claim 16, wherein the control circuit is further configured to:

reassert the reset signal asynchronously in the IQ divider to restore an initial condition of the IQ divider;

deassert the reset signal on a next positive edge of the reference clock; and position the reset signal with respect to an input clock of the IQ divider based on a failure scenario.

20. The apparatus as claimed in claim 15, wherein the control circuit is further configured to determine a failure scenario based on an output of the AFC logic.

* * * * *